US012701895B2

(12) United States Patent
Ryu et al.

(10) Patent No.: US 12,701,895 B2
(45) Date of Patent: Aug. 4, 2026

(54) METHOD OF MANUFACTURING DISPLAY APPARATUS

(71) Applicant: Samsung Display Co., Ltd., Yongin-si (KR)

(72) Inventors: Jeyun Ryu, Yongin-si (KR); Sangyoon Lee, Yongin-si (KR); Jinsoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1069 days.

(21) Appl. No.: 17/654,366

(22) Filed: Mar. 10, 2022

(65) Prior Publication Data

US 2022/0293893 A1     Sep. 15, 2022

(30) Foreign Application Priority Data

Mar. 12, 2021     (KR) ........................ 10-2021-0032916

(51) Int. Cl.
| | |
|---|---|
| *H10K 71/70* | (2023.01) |
| *H10K 59/65* | (2023.01) |
| *H10P 72/00* | (2026.01) |
| *H10P 74/00* | (2026.01) |
| B23K 26/03 | (2006.01) |
| H10K 59/80 | (2023.01) |
| H10K 71/40 | (2023.01) |

(52) U.S. Cl.
CPC ............. *H10K 59/65* (2023.02); *H10K 71/70* (2023.02); *H10P 72/0616* (2026.01); *B23K 26/032* (2013.01); *H10K 59/8722* (2023.02); *H10K 59/873* (2023.02); *H10K 71/421* (2023.02)

(58) Field of Classification Search
CPC .... H10K 59/65; H10K 71/70; H10K 59/8722; H10K 71/142; H01L 21/67288; H01L 22/24; B23K 26/03; B23K 23/032; H10P 72/0616; H10P 74/235
See application file for complete search history.

(56) References Cited

U.S. PATENT DOCUMENTS

| | | | |
|---|---|---|---|
| 7,674,663 B2 | 3/2010 | Yamazaki et al. | |
| 10,840,317 B2 | 11/2020 | Oh et al. | |
| 10,969,623 B2 | 4/2021 | Nie | |
| 11,127,931 B2 | 9/2021 | Yoo et al. | |
| 2003/0017658 A1* | 1/2003 | Nishitani | .......... H01L 21/02678 |
| | | | 438/149 |

(Continued)

FOREIGN PATENT DOCUMENTS

| | | |
|---|---|---|
| CN | 109768188 A | 5/2019 |
| CN | 110534550 A | 12/2019 |
| JP | 2002-103459 A | 4/2002 |

(Continued)

*Primary Examiner* — David Vu
*Assistant Examiner* — Brandon C Fox
(74) *Attorney, Agent, or Firm* — Womble Bond Dickinson (US) LLP

(57)     ABSTRACT

A method of manufacturing a display apparatus is provided. The method includes forming a test area on a display substrate, irradiating a first laser to the test area and determining relative positions of the test area and a first irradiation area formed by irradiating the first laser to the test area, and correcting a position of a second laser irradiated to the display substrate based on the relative positions of the test area and the first irradiation area.

20 Claims, 29 Drawing Sheets

(56) References Cited

U.S. PATENT DOCUMENTS

| | | | |
|---|---|---|---|
| 2022/0013751 A1* | 1/2022 | Chen | H10K 71/421 |
| 2022/0052082 A1* | 2/2022 | Seok | H10D 86/0251 |

FOREIGN PATENT DOCUMENTS

| | | |
|---|---|---|
| JP | 2004-128421 A | 4/2004 |
| JP | 2005-152906 | 6/2005 |
| KR | 10-0538003 B1 | 12/2005 |
| KR | 10-2011-0023434 | 3/2011 |
| KR | 10-1122240 B1 | 3/2012 |
| KR | 10-2020-0036994 A | 4/2020 |
| KR | 10-2020-0102580 A | 9/2020 |
| KR | 10-2022-0006155 A | 1/2022 |

\* cited by examiner

NDA2

AR1-1

1 2 3 4 5 6 7 8 9 10 11

D

Laser 1-1

Laser 1-2

C

Laser 1-3

Laser 1-4

AR1

DA

NDA2

AR1-1

|   | 1 | 2 | 3 | 4 | 5 | 6 | 7 | 8 | 9 | 10 | 11 |   |
|---|---|---|---|---|---|---|---|---|---|----|----|---|

D

Laser 1-1

Laser 1-2

C

Laser 1-3

Laser 1-4

AR1  AR2  AR1-1

AR3

1  2  3  4  5  6  7  8  9  10  11

D

Laser 1-1

Laser 1-2

C

Laser 1-3

Laser 1-4

X

Y

Z

OLED: 221, 222a, 222b, 222c, 223

METHOD OF MANUFACTURING DISPLAY APPARATUS

CROSS-REFERENCE TO RELATED APPLICATION

This application claims priority to and the benefit of Korean Patent Application No. 10-2021-0032916, filed on Mar. 12, 2021, in the Korean Intellectual Property Office (KIPO), the entire disclosure of which is incorporated by reference herein.

BACKGROUND

1. Field

One or more embodiments relate to a method, and more particularly, to a method of manufacturing a display apparatus.

2. Description of the Related Art

Display apparatuses visually display data. Display apparatuses may be provided as displays of small products such as mobile phones, or may be provided as displays of large products such as televisions.

Display apparatuses include a plurality of pixels that receive an electrical signal and emit light. The light may be emitted to the outside in order to display images. Each pixel of display apparatuses includes a light-emitting diode. For example, an organic light-emitting display apparatus includes an organic light-emitting diode (OLED) as a light-emitting diode. In general, an organic light-emitting display apparatus includes a thin-film transistor and an OLED, which are formed on a substrate. The thin-film transistor may drive the OLED to emit light.

Recently, as the use of display apparatuses is diversified, various designs for improving the quality of the display apparatuses are being researched. For example, a display apparatus may include a transmissive area in which a camera, a sensor, etc. may be arranged inside a display area in which images are displayed. A laser may be irradiated to the display apparatus to form such a transmissive area. As such, research on a design for forming a transmissive area by irradiating a laser into a preset processing area have been conducted. For example, various studies have been conducted to increase processing precision through a laser.

SUMMARY

Generally, according to related art methods of manufacturing a display apparatus, it may be difficult or even impossible to predict an area to which a laser is irradiated on a display substrate.

Aspects of one or more embodiments of the present disclosure are directed toward a method of manufacturing a display apparatus in which a defect rate of a display substrate is reduced by irradiating a laser to a part of a preset processing area of the display substrate and predicting and correcting a position to which the laser is irradiated. However, these aspects are merely examples and the scope of the present disclosure is not limited thereto.

Additional aspects will be set forth in part in the description which follows and, in part, will be apparent from the description, or may be learned by practice of the presented embodiments of the disclosure.

According to one or more embodiments, a method of manufacturing a display apparatus includes forming a test area on a display substrate, irradiating a first laser to the test area and determining relative positions of the test area and a first irradiation area formed by irradiating the first laser to the test area, and correcting a position of a second laser irradiated to the display substrate based on the relative positions of the test area and the first irradiation area.

The second laser may form an annular second irradiation area within a processing area of the display substrate.

The method may further include removing a part of the display substrate along the processing area.

The method may further include acquiring an image of the test area.

The method may further include calculating a displacement between a center of the test area and a center of the first irradiation area.

The display substrate may include a plurality of cells, and the test area may be arranged inside the plurality of cells (e.g., each of the plurality of cells) or outside the plurality of cells (e.g., each of the plurality of cells).

A plurality of first lasers may be concurrently (e.g., simultaneously) irradiated to cells located in a same column from among the plurality of cells.

A plurality of second lasers may be concurrently (e.g., simultaneously) irradiated to cells located in a same column from among the plurality of cells.

A cell from among the plurality of cells may include a display area and a peripheral area. The test area may be arranged in the peripheral area or outside the peripheral area.

According to one or more embodiments, a method of manufacturing a display apparatus includes forming a first irradiation area by irradiating a first laser to a test area of a first display substrate, forming a second irradiation area by irradiating a second laser to a processing area of the first display substrate, determining relative positions of the test area and the first irradiation area, changing an irradiation position of the first laser and an irradiation position of the second laser based on the relative positions of the test area and the first irradiation area, irradiating the first laser to a test area of a second display substrate at the changed irradiation position of the first laser, and irradiating the second laser to a processing area of the second display substrate at the changed irradiation position of the second laser.

The method may further include photographing the test area and the first irradiation area.

The method may further include calculating a displacement between a center of the test area of the first display substrate and a center of the first irradiation area of the first display substrate.

Each of the first display substrate and the second display substrate may include a plurality of cells. The test area may be arranged inside the plurality of cells or outside the plurality of cells.

A plurality of first lasers may be concurrently (e.g., simultaneously) irradiated to cells located in a same column from among the plurality of cells.

A plurality of second lasers may be concurrently (e.g., simultaneously) irradiated to cells located in a same column from among the plurality of cells.

A cell from among the plurality of cells may include a display area and a peripheral area. The test area may be arranged in the peripheral area or outside the peripheral area.

The method may further include separating the plurality of cells from each other.

The method may further include removing a part of one of the first display substrate and the second display substrate along the processing area.

The second irradiation area may be annular.

The first irradiation area may have a circular shape, an annular shape, or a cross shape.

These and/or other aspects will become apparent and more readily appreciated from the following description of the embodiments, taken in conjunction with the accompanying drawings.

These general and specific embodiments may be implemented by using a system, a method, a computer program, or a combination thereof.

BRIEF DESCRIPTION OF THE DRAWINGS

The above and other aspects, features, and effects of one or more embodiments of the present disclosure will be more apparent from the following description taken in conjunction with the accompanying drawings, in which:

FIG. 4A is a schematic cross-sectional view illustrating a method of manufacturing a display apparatus according to one or more embodiments;

FIGS. 17A to 17C are cross-sectional views illustrating a method of manufacturing a display apparatus according to one or more embodiments; and FIG. 18 is a schematic cross-sectional view of a display apparatus according to one or more embodiments.

DETAILED DESCRIPTION

Figure 1:
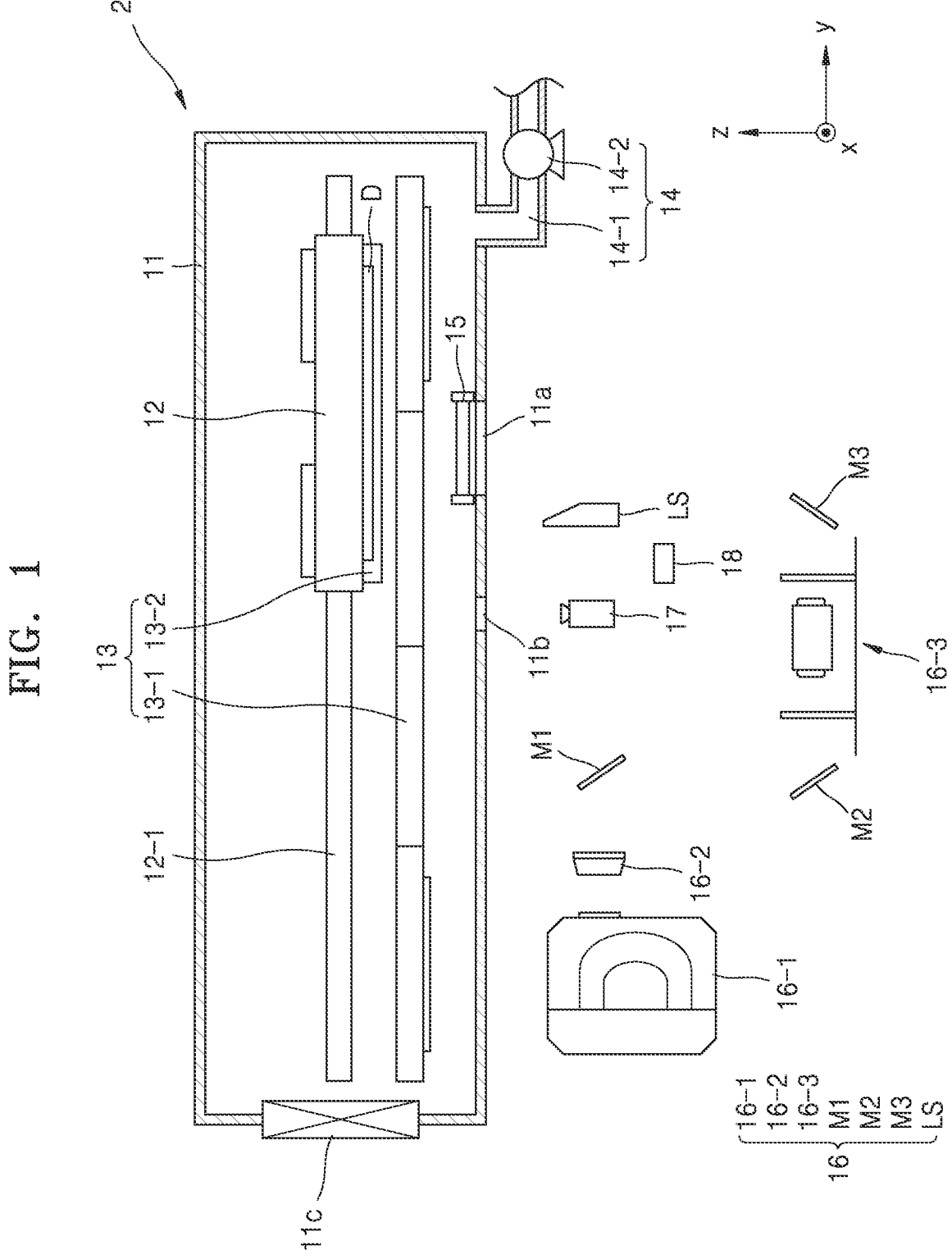
FIG. 1 is a schematic cross-sectional view of an apparatus for manufacturing a display apparatus according to one or more embodiments.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the terminology and descriptions set forth herein. Accordingly, the embodiments are merely described in reference to the drawings to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

Hereinafter, the present embodiments are described in more detail with reference to the accompanying drawings. In the drawings, the same reference numerals are given to the same or corresponding elements, and repeated description thereof is omitted.

It will be understood that although terms such as "first" and "second" may be used herein to describe various components, these components should not be limited by these terms and these terms are only used to distinguish one component from another component.

Further, the use of "may" when describing embodiments of the present disclosure refers to "one or more embodiments of the present disclosure."

Also, as used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when an element is referred to as being "on," "connected to," or "coupled to" another layer, region, or component, it may be directly on, connected, or coupled to the other layer, region, or component or one or more intervening elements may also be present. When an element is referred to as being "directly on," "directly connected to," or "directly coupled to" another layer, region, or component, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element's or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The x-axis, the y-axis, and the z-axis are not limited to three axes of the rectangular coordinate system and may be interpreted in a broader sense. For example, the x axis, the y axis, and the z axis may be perpendicular to each other, or may represent different directions that are not perpendicular to each other.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value When a certain embodiment may be implemented differently, a particular process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view of an apparatus 2 for manufacturing a display apparatus according to one or more embodiments.

Referring to FIG. 1, the apparatus 2 for manufacturing a display apparatus may include a chamber 11, a moving unit 12, a guide unit 12-1, a driver 13, a pressure adjuster 14, a protection window 15, a processor 16, a vision unit 17, and a controller 18. The processor 16, the vision unit 17, and the controller 18 may each be fixed through a support.

The chamber 11 may have a space formed therein, and may be formed such that a part of the chamber 11 is open. A gate valve 11c may be installed in the open part of the chamber 11 to selectively open and close the open part of the chamber 11. Also, the chamber 11 may include a first transmission window 11a and a second transmission window 11b. Various suitable equipment arranged outside the chamber 11 may process the surface of a display substrate D located inside the chamber 11 or acquire an image of the surface of the display substrate D, through the first transmission window 11a and the second transmission window 11b. For example, the first transmission window 11a and the second transmission window 11b may function as mediums connecting the inside of the chamber 11 to the outside of the chamber 11. For example, the first transmission window 11a and the second transmission window 11b may each be between the inside of the chamber 11 and the outside of the chamber 11. Although two transmission windows are illustrated in FIG. 1, the number of transmission windows may suitably vary (e.g., be one or more than two transmission windows). The first transmission window 11a and the second transmission window 11b may include glass, acrylic, and/or the like.

The moving unit 12 to which the display substrate D is attached may move in a y-direction through the guide unit 12-1 and the driver 13. Through the guide unit 12-1, the moving unit 12 may move in a straight line without being inclined. For example, the guide unit 12-1 may be a linear motion (LM) guide. Although one guide unit 12-1 is illustrated in FIG. 1, when viewed from an xy plane, two guide units 12-1 each extending in the y direction and arranged parallel to each other may be arranged.

The driver 13 may include a linear motor system (LMS) magnet 13-1 and a magnetic body 13-2. Although the LMS magnet 13-1 and the magnetic body 13-2 are each illustrated as one in FIG. 1, when viewed from the xy plane, two LMS magnets 13-1 each extending in the y direction and arranged parallel to each other, and two magnetic bodies 13-2 each extending in the y direction and arranged parallel to each other may be arranged. The display substrate D may be located between the two magnetic bodies 13-2. A linear motor may be configured by combining the LMS magnet 13-1 and the magnetic body 13-2, and the moving unit 12 may be transferred in the y-direction by the linear motor. For example, the magnetic body 13-2 may be a coil. When the moving unit 12 moves along the driver 13, the moving unit 12 may move through a magnetic levitation wireless charging system. The moving unit 12 may include a posture adjuster for changing the position of the display substrate D or finely adjusting the position of the moving unit 12 itself.

The display substrate D attached to the moving unit 12 may be a display apparatus or a part constituting the display apparatus. For example, the display substrate D may include a thin-film transistor, an organic light-emitting diode, and/or the like.

The pressure adjuster 14 may be connected to the chamber 11 to adjust (e.g., selectively adjust) the pressure inside the chamber 11 to be similar to atmospheric pressure or vacuum. In this case, the pressure adjuster 14 may include a connection pipe 14-1 connected to the chamber 11 and a pressure control pump 14-2 arranged on the connection pipe 14-1.

The protection window 15 may overlap or cover the first transmission window 11a and may be arranged inside the chamber 11. The protection window 15 may protect the first transmission window 11a. The first transmission window 11a may correspond to a portion through which a laser emitted from the processor 16 to be described below passes. In this case, the laser emitted from the processor 16 through the first transmission window 11*a* may reach the display substrate D, and an organic layer and/or the like included in the display substrate D may be partially removed. Particles of the organic layer and/or the like separated from the display substrate D by the laser may be distributed or dispersed in the chamber 11 and attached to the surface of the first transmission window 11*a* through which the laser passes. The laser passing through the first transmission window 11*a* may sensitively react to a foreign material attached to the surface of the first transmission window 11*a*, and thus may not reach a target point. For example, the foreign material may interfere with a path of the laser directed toward the target point. Accordingly, the protection window 15 may be arranged inside the chamber 11 to prevent or substantially prevent a foreign material from adhering to the surface of the first transmission window 11*a*, and protect the first transmission window 11*a*.

In one or more embodiments, when the inside of the chamber 11 is maintained in a high vacuum state by the pressure adjuster 14, the first transmission window 11*a* and the protection window 15, which are portions through which the laser passes, may be kept clean without a foreign material by replacing only the protection window 15 while maintaining the inside of the chamber 11 in a high vacuum state. A method of replacing only the protection window 15 while maintaining the inside of the chamber 11 in a high vacuum state may be one of various suitable method used, such as a method of separately preparing a vacuum chamber including a clean protection window 15 and replacing it through the gate valve 11*c*. When the protection window 15 is not used, the surface of a transmission window may be kept clean by directly washing the transmission window after changing the pressure inside the chamber 11 to atmospheric pressure. In this case, because of a direct cleaning of the transmission window and change of the pressure inside the chamber 11 to a high vacuum state, the processing time of the display substrate D may increase. However, when the protection window 15 is arranged to overlap or cover the first transmission window 11*a*, the first transmission window 11*a* and the protection window 15 may be kept clean by replacing only the protection window 15 while maintaining the internal pressure of the chamber 11 in a high vacuum state, and thus, a processing time may be reduced.

The processor 16 may include a laser light source unit 16-1, a laser beam dump 16-2, first to third mirror units M1, M2, and M3, an optical component 16-3, and a laser scanner LS. The processor 16 may be arranged outside the chamber 11 and may irradiate a laser to the surface of the display substrate D through the first transmission window 11*a*. This may be to prevent or substantially prevent malfunction of and damage to the processor 16 when the inside of the chamber 11 is maintained in a high vacuum state by the pressure adjuster 14.

The laser light source unit 16-1 may generate and output a laser. Accordingly, the laser light source unit 16-1 may adjust a frequency at which the laser is emitted and/or the intensity of the laser.

The laser beam dump 16-2 may be arranged adjacent to the laser light source unit 16-1 to absorb and extinguish a laser output from the laser light source unit 16-1. For example, the laser beam dump 16-2 may serve to select whether to allow the laser output from the laser light source unit 16-1 to continuously travel. Although the laser beam dump 16-2 is illustrated to be arranged in a direction in which the laser travels from the laser light source unit 16-1 in FIG. 1, the laser beam dump 16-2 may not be provided.

The laser output from the laser light source unit 16-1 may sequentially reach the first to third mirror units M1, M2, and M3. A direction in which the laser travels through the first to third mirror units M1, M2, and M3 may be changed. For example, an angle at which the laser is reflected may be changed by adjusting the angles of the first to third mirror units M1, M2, and M3, and thus, the direction in which the laser travels may be changed. When the angles of the first to third mirror units M1, M2, and M3 are adjusted, the first to third mirror units M1, M2, and M3 may rotate.

A laser that has reached each of the first and second mirror units M1 and M2 may pass through the optical component 16-3. The optical component 16-3 may change the shape and/or quality of the laser. The optical component 16-3 may include a laser beam size adjuster, a laser beam power adjuster, and/or the like, and may adjust the size of the laser and power at which the laser is emitted. For example, the laser beam size adjuster may be a beam expander. Although the optical component 16-3 is illustrated to be located between the second mirror unit M2 and the third mirror unit M3 in FIG. 1, the optical component 16-3 may be located between the first mirror unit M1 and the second mirror unit M2. As shown in FIG. 1, the optical component 16-3 may be arranged between protective layers extending in a z-direction and be protected.

A laser passing through the optical component 16-3 may reach the laser scanner LS through the third mirror unit M3. The laser scanner LS may adjust a position (e.g., coordinates) to which the laser is to be finally irradiated. The laser scanner LS may include a galvanometer scanner, which is a fine-tuning motor, and a mirror attached to the galvanometer scanner, and when the angle of the mirror is adjusted using the galvanometer scanner, a position to which the laser is to be irradiated may be adjusted. In one or more embodiments, because the position to be irradiated with the laser may be adjusted through the laser scanner LS, the shape of an area processed by the laser may also be changed. For example, the shape of the area processed by the laser may be a circular shape, a ring shape, or a cross shape, and in addition, the shape of the processed area may suitably vary.

The surface of the display substrate D attached to the moving unit 12 may be observed through the vision unit 17, and an image of the surface of the display substrate D may be acquired. The vision unit 17 may observe the entire surface of the display substrate D or a part thereof. In one or more embodiments, the vision unit 17 may continuously image (e.g., photograph) the position of an object to be observed while the display substrate D is moved by the moving unit 12. For example, the vision unit 17 may be a camera.

The vision unit 17 may be arranged outside the chamber 11, and the surface of the display substrate D may be observed through the second transmission window 11*b*. This may be to prevent or substantially prevent malfunction of and damage to the vision unit 17 when the inside of the chamber 11 is maintained in a high vacuum state by the pressure adjuster 14.

The controller 18 may analyze the image of the surface of the display substrate D, the image being acquired through the vision unit 17, and transmit the analyzed image to the laser scanner LS of the processor 16.

Figure 2:
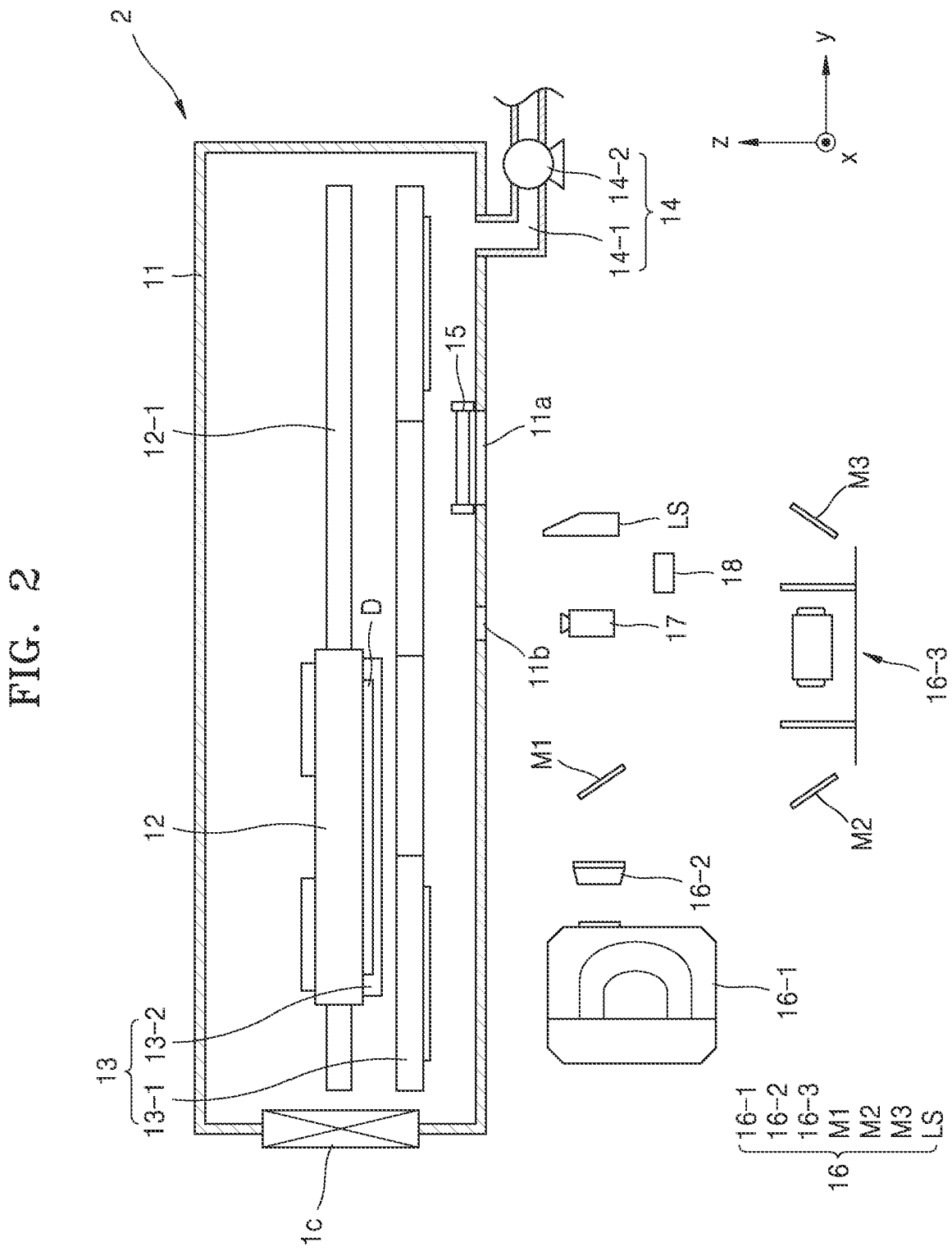
FIG. 2 is a schematic cross-sectional view illustrating a method of manufacturing a display apparatus according to one or more embodiments.
Figure 3:
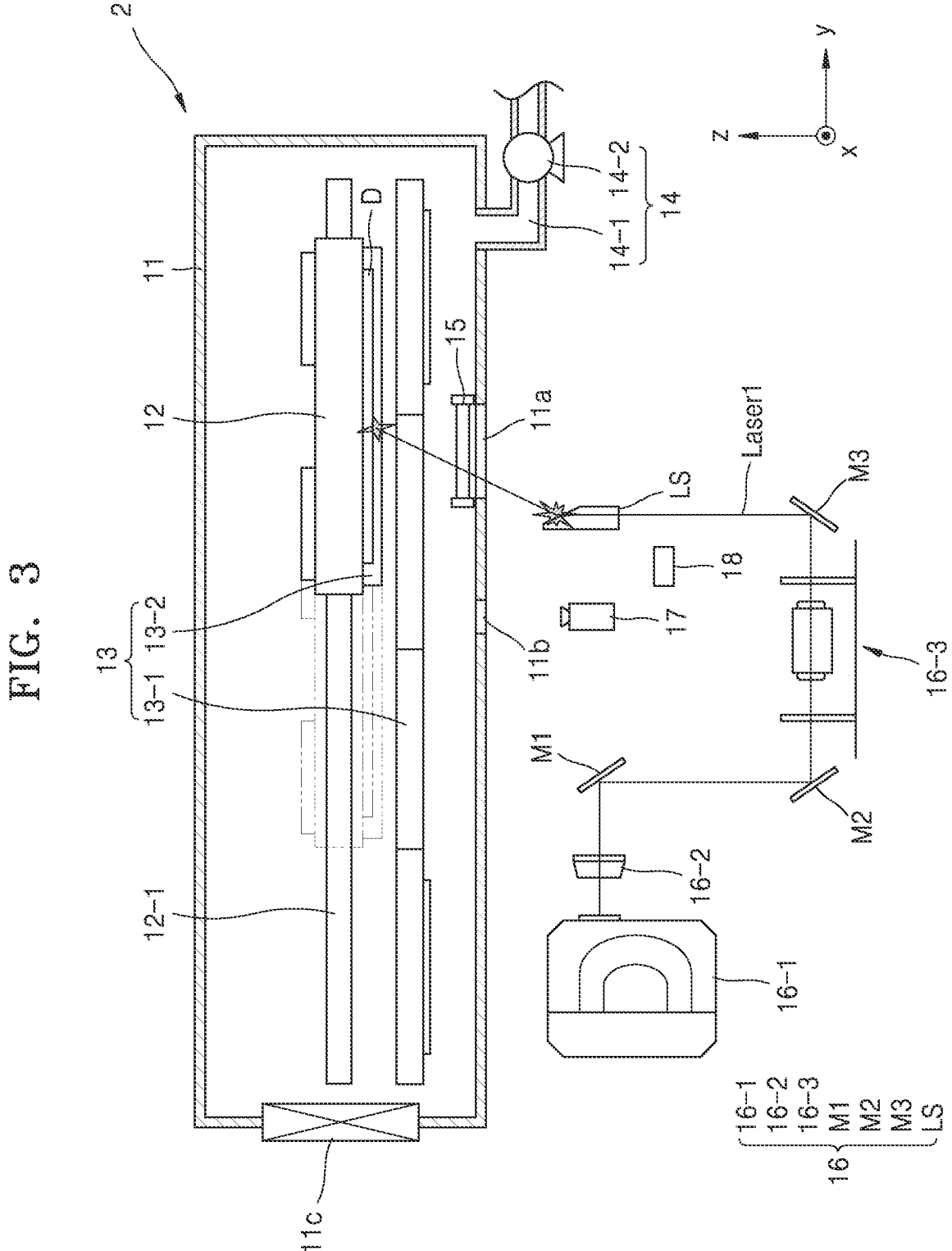
FIG. 3 is a schematic cross-sectional view illustrating a method of manufacturing a display apparatus according to one or more embodiments.
Figure 4A:
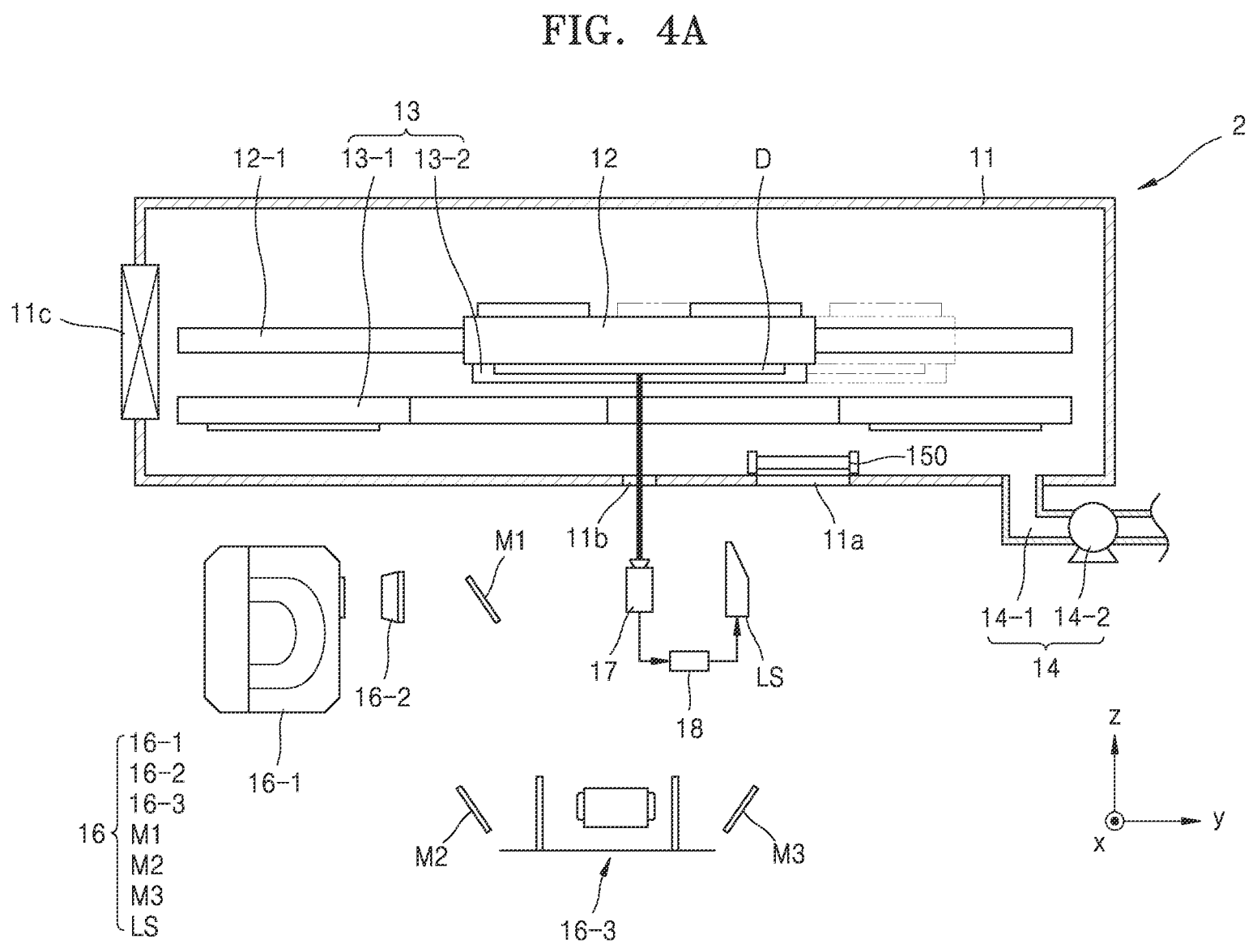
Figure 4B:
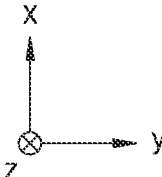
FIG. 4B is a plan view illustrating a display substrate according to one or more embodiments.
Figure 4C:
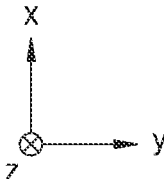
FIG. 4C is a plan view illustrating a display substrate according to one or more embodiments.
Figure 4D:
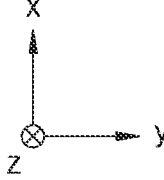
FIG. 4D is a plan view illustrating a display substrate according to one or more embodiments.
Figure 4E:
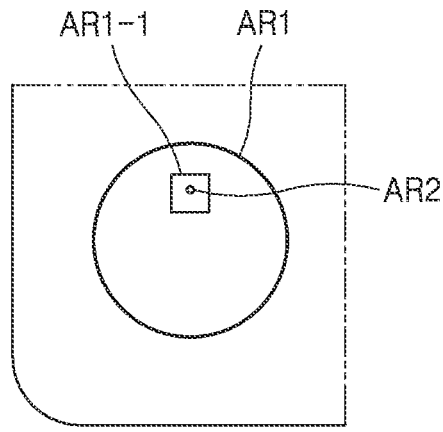
FIGS. 4E to 4H are schematic plan views illustrating a method of manufacturing a display apparatus according to one or more embodiments.

FIG. 2 is a schematic cross-sectional view illustrating a method of manufacturing a display apparatus according to one or more embodiments. FIG. 3 is a schematic cross-sectional view illustrating a method of manufacturing a display apparatus according to one or more embodiments. FIG. 4A is a schematic cross-sectional view illustrating a method of manufacturing a display apparatus according to one or more embodiments. FIG. 4B is a plan view illustrating a display substrate D according to one or more embodiments. FIG. 4C is a plan view illustrating a display substrate D according to one or more embodiments. FIG. 4D is a plan view illustrating a display substrate D according to one or more embodiments. FIGS. 4E to 4H are schematic plan views illustrating a method of manufacturing a display apparatus according to one or more embodiments. FIG. 5A is a schematic cross-sectional view illustrating a method of manufacturing a display apparatus according to one or more embodiments. FIG. 5B is a schematic plan view illustrating a method of manufacturing a display apparatus according to one or more embodiments. The same reference numerals as in FIG. 1 refer to the same members, and redundant descriptions thereof will not be provided.

Referring to FIGS. 2 to 5B, the display substrate D may be prepared. The display substrate D may include at least one cell C. A plurality of cells C may be provided, and the plurality of cells C may be arranged to be spaced from each other. In this case, the plurality of cells C may be separated from each other after arrangement of one or more suitable layers or members on the display substrate D to form a single display panel. Hereinafter, for convenience of description, a case in which the display substrate D includes a plurality of cells C will be primarily described in more detail. The display substrate D as described above may include a test area AR1-1. The test area AR1-1 may be arranged inside a processing area AR1 to be described below or may be arranged outside each cell C.

Referring to FIG. 4B, the test area AR1-1 may be arranged inside the processing area AR1. On the other hand, referring to FIGS. 4C and 4D, the test area AR1-1 may be arranged outside the processing area AR1, and may be arranged outside each cell C. A plurality of organic light-emitting diodes may be arranged in each cell C, and when manufactured as a display panel, each cell C may form a display area for implementing or displaying an image. In this case, when the plurality of cells C are separated from each other, a single display panel may be formed, and such a display panel may include a display area DA and a peripheral area NDA (see FIG. 7). In one or more embodiments, the peripheral area NDA may be a non-display area where an image is not implemented or displayed. The test area AR1-1 may be arranged in the peripheral area NDA or may be arranged outside the peripheral area NDA. Hereinafter, for convenience of description, a case in which the test area AR1-1 is arranged in the processing area AR1 will be primarily described in more detail.

A test metal layer may be arranged in the test area AR1-1. In this case, the test metal layer may be arranged in the entire test area AR1-1, and may have the same planar shape as the test area AR1-1. The planar shape of the test metal layer may have one or more suitable shapes. For example, the planar shape of the test metal layer may be a circular shape, an oval shape, or a polygonal shape. Hereinafter, for convenience of description, a case in which the test metal layer is square will be primarily described in more detail. However, the present disclosure is not limited thereto.

An intermediate layer, an opposite electrode, and a capping layer may be arranged on the test metal layer as described above.

The pressure adjuster 14 may maintain the inside of the chamber 11 at atmospheric pressure, and after the gate valve 11c is opened, the display substrate D attached to the moving unit 12 may be inserted into the chamber 11. Thereafter, the pressure adjuster 14 may maintain the inside of the chamber 11 to be almost vacuum-like.

After the display substrate D is loaded, the display substrate D may be aligned. For example, an alignment camera may be arranged inside or outside the chamber 11, and the alignment camera may align the display substrate D through an image obtained by photographing the display substrate D. For example, an alignment key is displayed at each vertex of the display substrate D, and the alignment camera may photograph the alignment key displayed at each vertex of the display substrate D. When the display substrate D is tilted or misaligned, the alignment key is not completely captured by the alignment camera, and thus, the display substrate D may then be aligned through the image captured by the alignment camera. For example, the display substrate D may be aligned by moving the display substrate D so that the alignment key is completely captured by the alignment camera.

After the display substrate D is aligned, the display substrate D may move in a first direction (e.g., a +y direction) with a constant speed. In this case, the first direction may be different from a direction in which a first laser Laser1 is incident on the surface of the display substrate D. The display substrate D may be adjacent to the first transmission window 11a of the chamber 11, and irradiating the first laser Laser1 to a part of the preset processing area AR1 of the display substrate D may be performed. Although the first laser Laser1 is illustrated as passing through the LMS magnet 13-1 in FIG. 3, it may be understood that the moving unit 12 may move through two LMS magnets 13-1, spaced from each other, as described above with reference to FIG. 1 and the first laser Laser1 travels to an empty space between the two LMS magnets 13-1 spaced from each other.

Before the first laser Laser1 is irradiated to a part of the preset processing area AR1 of the display substrate D, a frequency at which the first laser Laser1 is emitted through the laser light source unit 16-1, and/or the intensity of the first laser Laser1 may be adjusted, and the shape and/or quality of the first laser Laser1 may be changed through the optical component 16-3. In one or more embodiments, by adjusting the galvanometer scanner of the laser scanner LS, a position at which the first laser Laser1 is irradiated to the display substrate D may be adjusted. For example, the first laser Laser1 may be irradiated to a part of the processing area AR1 of the display substrate D by controlling the galvanometer scanner of the laser scanner LS. As shown in FIG. 4E, a first irradiation area AR2 may be formed as the processing area AR1 of the display substrate D is locally processed by the first laser Laser1.

Irradiating the first laser Laser1 to a part of the preset test area AR1-1 of the display substrate D may be done while the display substrate D moves in the first direction (e.g., the +y direction) with a constant speed. This act may be referred to as "motion processing". As another example, when the display substrate D moves in the first direction with a constant speed and reaches a preset processing area AR1, the display substrate D stops and the first laser Laser1 may be irradiated to a part of the processing area AR1. This act may be referred to as "step processing".

Referring to FIG. 4B, there may be at least one first laser Laser1. When there is only one first laser Laser1, the formation of the processing area AR1 through the first laser Laser1 may be sequentially performed. As another embodiment, the number of first lasers Laser1 may be plural. The plurality of first lasers Laser1 may perform processing at the same time.

Hereinafter, for convenience of description, a case in which there are a plurality of first lasers Laser1 will be primarily described in more detail. For example, as shown in FIG. 4B, there may be a total of four first lasers Laser1. For example, the first laser Laser1 may include a first-first laser Laser1-1, a first-second laser Laser1-2, a first-third laser Laser1-3, and a first-fourth laser Laser1-4.

When the display substrate D includes a plurality of cells C, the plurality of cells C may be arranged in or along a row direction (a y-direction) and a column direction (an x-direction). Each of the plurality of cells C may include a preset processing area AR1. In this case, the planar shape of the processing area AR1 may be a circular shape, an oval shape, or a polygonal shape.

In an embodiment, as shown in FIG. 4B, a plurality of cells C arranged in a first row may be irradiated with the first-first laser Laser1-1, a plurality of cells C arranged in a second row may be irradiated with the first-second laser Laser1-2, a plurality of cells C arranged in a third row may be irradiated with the first-third laser Laser1-3, and a plurality of cells C arranged in a fourth row may be irradiated with the first-fourth laser Laser1-4.

As described above in FIG. 3, the display substrate D may move in the first direction (e.g., the +y direction) with a constant speed. When the display substrate D moves in the first direction, cells C arranged in an eleventh column from among the plurality of cells C are first adjacent to the laser scanner LS. The first laser Laser1 may be sequentially irradiated to the cells C arranged in the eleventh column to cells C arranged in a first column. While the display substrate D moves in the first direction with a constant speed, the first laser Laser1 may be sequentially irradiated to the cells C arranged in the eleventh column to the cells C arranged in the first column (motion processing). As another example, when the display substrate D moves in the first direction with a constant speed and reaches the cells C arranged in the eleventh column, the display substrate D stops and the first laser Laser1 may be irradiated to a part of the preset processing area AR1 of each of the cells C arranged in the eleventh column (step processing).

In one or more embodiments, because there may be a plurality of first lasers Laser1, cells C arranged in the same column may be concurrently (e.g., simultaneously) irradiated with the first lasers Laser1. For example, a cell C located in a first row from among the cells C arranged in the first column may be irradiated with the first-first laser Laser1-1, a cell C located in a second row from among the cells C arranged in the first column may be irradiated with the first-second laser Laser1-2, a cell C located in a third row from among the cells C arranged in the first column may be irradiated with the first-third laser Laser1-3, and a cell C located in a fourth row from among the cells C arranged in the first column may be irradiated with the first-fourth laser Laser1-4. The cells C arranged in the first column may be concurrently (e.g., simultaneously) irradiated with the first laser Laser1 so that a part of the preset processing area AR1 may be processed, and a first irradiation area AR2 may be formed in the preset processing area AR1 in each of the cells C arranged in the first column.

The shape of the first irradiation area AR2 formed in the preset processing area AR1 may be circular. The shape of the first irradiation area AR2 may be determined by the laser scanner LS. For example, while the first laser Laser1 is irradiated to the processing area AR1 several times at a constant frequency, a direction in which the first laser Laser1 is irradiated through the laser scanner LS may be varied, and the first laser Laser1 irradiated to the processing area AR1 may gather to form the first irradiation area AR2 and the shape of the first irradiation area AR2 may be determined.

After the first laser Laser1 is irradiated to a part of the preset processing area AR1 of the display substrate D, the display substrate D may move in a second direction (e.g., a −y direction) opposite to the first direction (e.g., the +y direction) with a constant speed. The display substrate D may be adjacent to the second transmission window 11b of the chamber 11, and an image of the preset processing area AR1 of the display substrate D may be acquired through the vision unit 17. The image of the processing area AR1 acquired through the vision unit 17 may be transmitted to the controller 18, and the controller 18 may analyze the acquired image. Image data analyzed by the controller 18 may be transmitted to the laser scanner LS.

In an embodiment, when acquiring an image of the processing area AR1 and/or the test area AR1-1 of the display substrate D through the vision unit 17, the vision unit 17 may be one camera. An image of a processing area AR1 and/or a test area AR1-1 of each of the plurality of cells C may be acquired through one camera. This may be to maintain the uniformity of the image of the processing area AR1 and/or the test area AR1-1 of each of the plurality of cells C.

When acquiring the image of the processing area AR1 and/or the test area AR1-1 of each of the plurality of cells C through one camera, images of processing areas AR1 of cells C located in substantially the same column from among the plurality of cells C may be sequentially acquired. In one or more embodiments, images of processing areas AR1 and/or test areas AR1-1 of cells C located in an odd column from among the plurality of cells C may be sequentially acquired in a third direction (e.g., a +x direction), and images of processing areas AR1 and/or test areas AR1-1 of cells C located in an even column from among the plurality of cells C may be sequentially acquired in a fourth direction (e.g., a −x direction) opposite to the third direction. For example, the vision unit 17 may sequentially acquire images of processing areas AR1 and/or test areas AR1-1 of cells C located in the first column from among the plurality of cells C while moving in the third direction (e.g., the +x direction), and may move to acquire an image of a processing area AR1 and/or a test area AR1-1 of a cell C located in the first row from among cells C located in a second column. Thereafter, the vision unit 17 may sequentially acquire images of processing areas AR1 and/or test areas AR1-1 of cells C located in the second column from among the plurality of cells C while moving in the fourth direction (e.g., the −x direction) opposite to the third direction.

Figure 4F:
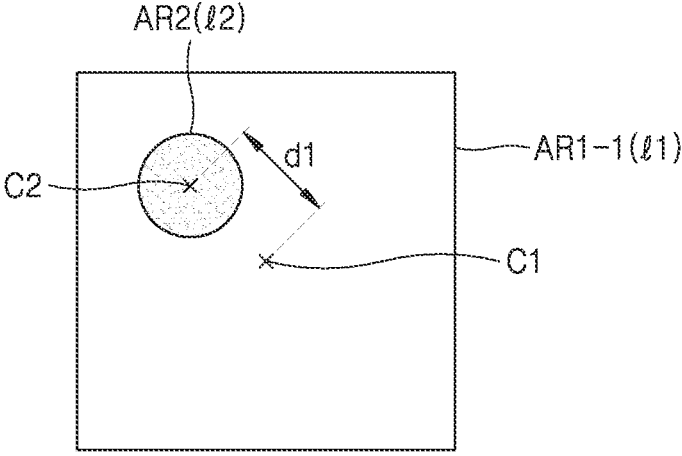
Figure 5A:
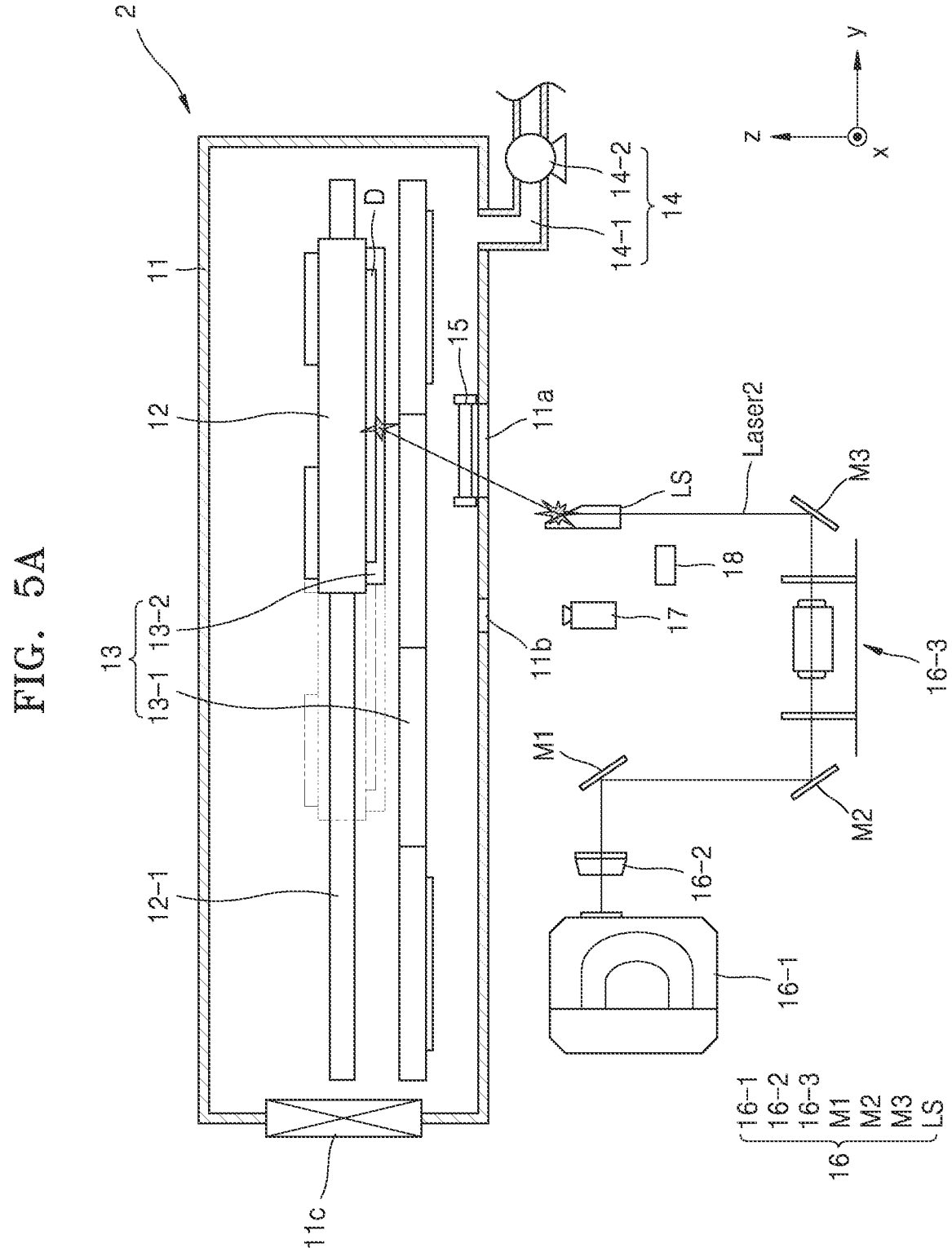
FIG. 5A is a schematic cross-sectional view illustrating a method of manufacturing a display apparatus according to one or more embodiments.
Figure 5B:
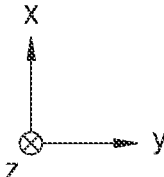
FIG. 5B is a schematic plan view illustrating a method of manufacturing a display apparatus according to one or more embodiments.

Referring to enlarged views of FIGS. 4E and 4F, a process of analyzing a second center C2 of the first irradiation area AR2 irradiated with the first laser Laser1 and a first center C1 of the preset test area AR1-1 may be performed using an image acquired through the vision unit 17. A first line f1 may be drawn along the shape of the preset test area AR1-1 recognized by grasping the position of the preset test area AR1-1, and the first center C1 of the test area AR1-1 may be derived through the first line f1. Similarly, a second line 2 may be drawn along the shape of the first irradiation area AR2 recognized by grasping the position of the first irradiation area AR2, and the second center C2 of the first irradiation area AR2 may be derived through the second line 2.

Next, a first displacement d1 between the second center C2 of the first irradiation area AR2 irradiated with the first laser Laser1 and the first center C1 of the preset test area AR1-1 may be calculated. Through the first displacement d1, the second center C2 of the first irradiation area AR2 irradiated with the first laser Laser1 may be adjusted to coincide with the first center C1 of the preset test area AR1-1. The calculated first displacement d1 may be transmitted to the laser scanner LS. Based on the first displacement d1, a position to be irradiated with a second laser Laser2 (e.g., see FIG. 5A) on the display substrate D may be adjusted.

Figure 4G:
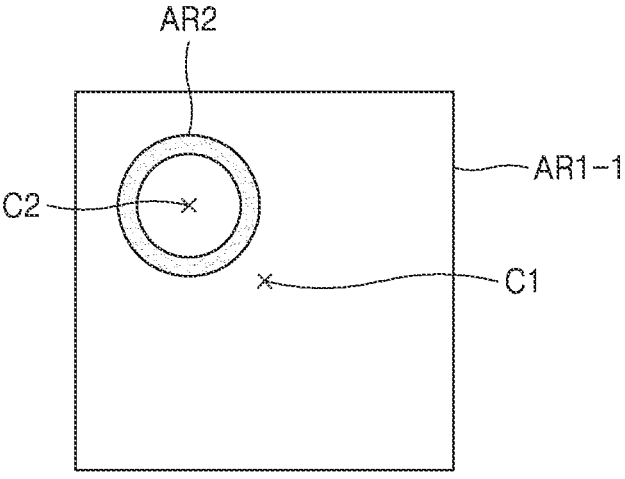
Figure 4H:
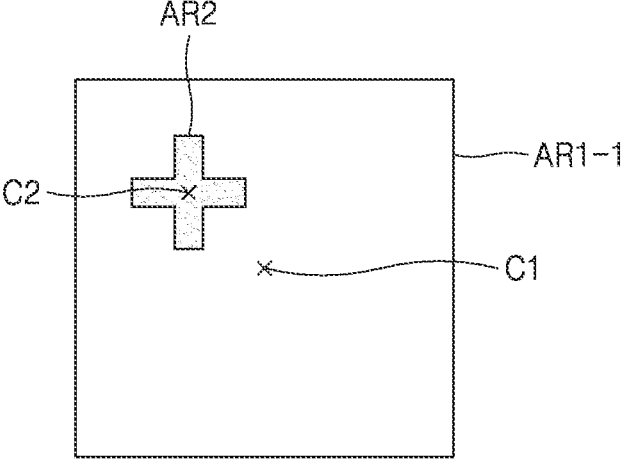

As shown in FIG. 4F, the shape of the first irradiation area AR2 may be circular. The edge of the first irradiation area AR2 formed by the first laser Laser1 irradiated several times with a constant frequency may be circular. As another example, as shown in FIGS. 4G and 4H, the shape of the first irradiation area AR2 may be a ring shape or a cross shape. The shape of the first irradiation area AR2 may be determined by the laser scanner LS.

Even when the shape of the first irradiation area AR2 is a ring shape or a cross shape, a second line 2 may be drawn along the shape of the first irradiation area AR2, as described above with reference to FIG. 4F, and the second center C2 of the first irradiation area AR2 may be derived through the second line 2. In particular, when the shape of the first irradiation area AR2 is a cross shape, it may be easy to derive the second center C2 of the first irradiation area AR2.

Referring to FIG. 5A, after a position to be irradiated with the second laser Laser2 on the display substrate D is adjusted based on the first displacement d1 calculated in FIG. 4F, the display substrate D may move again in the first direction (e.g., the +y direction) at a constant speed. In this case, the first direction may be different from a direction in which the second laser Laser2 is incident on the surface of the display substrate D. The display substrate D may be adjacent to the first transmission window 11a of the chamber 11, and the second laser Laser2 may be irradiated to a part of the preset processing area AR1 of the display substrate D. In FIG. 5A, the second laser Laser2 is illustrated as passing through the LMS magnet 13-1. However, it may be understood that the moving unit 12 may move through two LMS magnets 13-1, spaced from each other, as described above with reference to FIG. 1 and the second laser Laser2 travels to an empty space between the two LMS magnets 13-1 spaced from each other.

Before the second laser Laser2 is irradiated to the preset processing area AR1 of the display substrate D, a frequency at which the second laser Laser2 is emitted through the laser light source unit 16-1, and/or the intensity of the second laser Laser2 may be adjusted, and the shape and/or quality of the second laser Laser2 may be changed through the optical component 16-3. In one or more embodiments, by adjusting the galvanometer scanner of the laser scanner LS, a position at which the second laser Laser2 is irradiated to the display substrate D based on the first displacement d1 may be adjusted. For example, the second laser Laser2 may be irradiated to the processing area AR1 of the display substrate D by controlling the galvanometer scanner of the laser scanner LS. A second irradiation area AR3 may be formed as the processing area AR1 of the display substrate D is processed by the second laser Laser2.

Irradiating the second laser Laser2 to the preset test area AR1-1 of the display substrate D may be done while the display substrate D moves in the first direction (e.g., the +y direction) with a constant speed. As another example, when the display substrate D moves in the first direction with a constant speed and reaches a preset position, the display substrate D stops and the second laser Laser2 may be irradiated to the processing area AR1.

In this case, the planar shape of the processing area AR1 may be annular. In this case, when forming the processing area AR1 while the display substrate D moves, parts of processing areas AR1 of cells C may be sequentially formed when the display substrate D is moved, thereby forming one processing area AR1. As another embodiment, when forming the processing area AR1 while the display substrate D moves, the processing areas AR1 of the cells C may be formed at once when the display substrate D is moved, thereby forming one processing area AR1. In this case, the second laser Laser2 may have an annular shape. As another embodiment, when the processing area AR1 is formed after the display substrate D reaches a preset position and stops, the processing area AR1 may be formed at once or sequentially while the display substrate D is stopped.

In one or more embodiments, one or a plurality of second lasers Laser2 may be used. When there is only one second laser Laser2, the processing area AR1 may be formed in one cell C, and then the processing area AR1 may be formed in another adjacent cell C. As another embodiment, when there are a plurality of second lasers Laser2, the processing area AR1 may be formed in the plurality of cells C at the same time. For example, there may be a total of four second lasers Laser2. For example, the second laser Laser2 may include a second-first laser Laser2-1, a second-second laser Laser2-2, a second-third laser Laser2-3, and a second-fourth laser Laser2-4. Also, the display substrate D may include a plurality of cells C arranged in or along the row direction (the y-direction) and the column direction (the x-direction). Each of the plurality of cells C may include a preset processing area AR1. In this case, the second laser Laser2 may be irradiated to the plurality of cells C similarly to the first laser Laser1 illustrated in FIG. 3.

As described above in FIG. 5A, the display substrate D may move in the first direction (e.g., the +y direction) with a constant speed. When the display substrate D moves in the first direction, cells C arranged in an eleventh column from among the plurality of cells C are first adjacent to the laser scanner LS. The second laser Laser2 may be sequentially irradiated to the cells C arranged in the eleventh column to cells C arranged in a first column. While the display substrate D moves in the first direction with a constant speed, the second laser Laser2 may be sequentially irradiated to the cells C arranged in the eleventh column to the cells C arranged in the first column (motion processing). As another example, when the display substrate D moves in the first direction with a constant speed and reaches the cells C arranged in the eleventh column, the display substrate D stops and the second laser Laser2 may be irradiated to the preset processing area AR1 of each of the cells C arranged in the eleventh column (step processing).

In one or more embodiments, because there may be a plurality of second lasers Laser2, cells C arranged in substantially the same column may be concurrently (e.g., simultaneously) irradiated with the second lasers Laser2. For example, a cell C located in a first row from among the cells C arranged in the first column may be irradiated with the second-first laser Laser2-1, a cell C located in a second row from among the cells C arranged in the first column may be irradiated with the second-second laser Laser2-2, a cell C located in a third row from among the cells C arranged in the first column may be irradiated with the second-third laser Laser2-3, and a cell C located in a fourth row from among the cells C arranged in the first column may be irradiated with the second-fourth laser Laser2-4. The cells C arranged in the first column may be concurrently (e.g., simultaneously) irradiated with the second laser Laser2 so that the preset processing area AR1 may be processed, and a second irradiation area AR3 may be formed in the preset processing area AR1 in each of the cells C arranged in the first column.

The shape of the second irradiation area AR3 formed in the preset processing area AR1 may be circular. The shape of the second irradiation area AR3 may be determined by the laser scanner LS. For example, while the second laser Laser2 is irradiated to the processing area AR1 several times at a constant frequency, a direction in which the second laser Laser2 is irradiated through the laser scanner LS may be varied, and the second laser Laser2 irradiated to the processing area AR1 may gather to form the second irradiation area AR3 and the shape of the second irradiation area AR3 may be determined.

In the method of manufacturing a display apparatus according to one or more embodiments of the present disclosure, before processing is performed on the processing area AR1, the first laser Laser1 may be irradiated to a preset test area AR1-1 of the display substrate D, thereby correcting a process change without discarding the display substrate D, the process change being caused by replacement of a protective window, a change in a setting value of a laser light source, and/or damage to an optical component. Preliminary processing may be performed by irradiating the first laser Laser1 to a part of the preset test area AR1-1 of the display substrate D before processing is performed in the processing area AR1, and how far the center of the first irradiation area AR2 irradiated with the first laser Laser1 is away from the center of the test area AR1-1 may be checked before processing is performed on the processing area AR1. For example, when processing is performed on the processing area AR1, how far a laser-irradiated area will deviate from the processing area AR1 may be predicted. The coordinates of the second laser Laser2 to be irradiated to the display substrate D during the processing may be adjusted by calculating a displacement between the center of the first irradiation area AR2 irradiated with the first laser Laser1 and the center of the test area AR1-1, and thus, the second irradiation area AR3 irradiated with the second laser Laser2 may be formed in the processing area AR1. Accordingly, when processing is performed on the processing area AR1, the number of display substrates D to be discarded may be reduced because a case where the laser-irradiated area deviates from the processing area AR1 is reduced. A defect rate of the display substrate D may be reduced. In one or more embodiments, there is no time to reload the display substrate D in the chamber 11 because processing is performed on the test area AR1-1 on the display substrate D that has undergone preliminary processing, and in the preliminary processing, a laser-irradiated area is small and processing speed is fast, and thus, processing time is not greatly affected.

Figure 6:
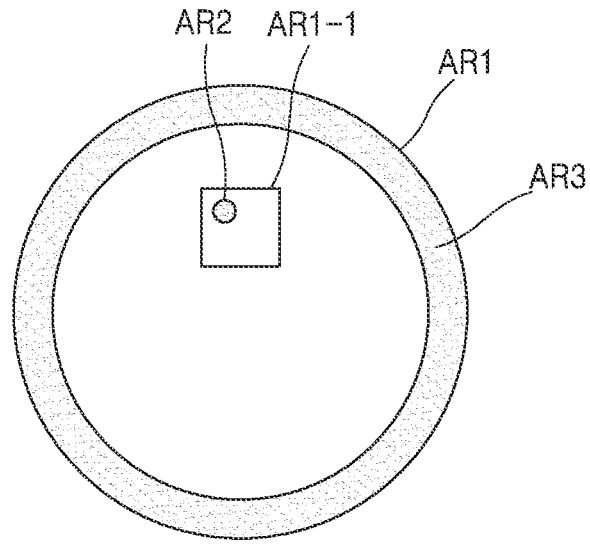
FIG. 6 is a plan view illustrating a part of a method of manufacturing a display apparatus according to one or more embodiments.

FIG. 6 is a plan view illustrating a part of a method of manufacturing a display apparatus according to one or more embodiments.

Referring to FIG. 6, one or more suitable methods may be used to accurately form the second irradiation area AR3 in the processing area AR1 of the display substrate D. For example, when one display substrate D includes a plurality of cells C, by concurrently (e.g., simultaneously) forming a first irradiation area AR2 and a second irradiation area AR3 in one of the plurality of cells C and then sensing the position of the first irradiation area AR2 and varying the irradiation position of the second laser Laser2, a first irradiation area AR2 and a second irradiation area AR3 in another adjacent cell C may be formed at exact positions. As another embodiment, when performing a process of a plurality of display substrates D, the position of a first irradiation area AR2 in one of the plurality of display substrates D may be sensed, and then, based on a result of the sensing, a second irradiation area AR3 of another one of the plurality of display substrates D may be adjusted. Hereinafter, a case in which the position of the second irradiation area AR3 is adjusted in the plurality of display substrates D will be primarily described in more detail.

For example, a plurality of display substrates D may be manufactured by forming a thin-film transistor, an organic light-emitting diode, and a test metal layer on a substrate.

After a first display substrate among the plurality of display substrates D is inserted into a chamber, the first display substrate may be aligned. Thereafter, a first laser Laser1 and a second laser Laser2 may be irradiated while moving the first display substrate, or the first laser Laser1 and the second laser Laser2 may be irradiated at a preset position after moving the first display substrate, and thus, the first irradiation area AR2 and the second irradiation area AR3 may be formed on the first display substrate.

In this case, the first irradiation area AR2 may be formed inside the test area AR1-1, and the second irradiation area AR3 may be formed inside the processing area AR1. In this case, the planar shape of the first irradiation area AR2 may be the same as or similar to that illustrated in FIG. 4E, 4G, or 4H.

After the first laser Laser1 and the second laser Laser2 are irradiated, a displacement between the center of the first irradiation area AR2 and the center of the test area AR1-1 by the first laser Laser1 may be measured. For example, the relative positions of the first irradiation area AR2 and the test area AR1-1 may be measured. In this case, the center of the first irradiation area AR2 and the center of the test area AR1-1 have to coincide with each other, but when the two centers do not coincide with each other, a degree of deviation of the center of the first irradiation area AR2 from the center of a preset position may be measured by measuring a separation distance between the center of the first irradiation area AR2 and the center of the test area AR1-1. In this case, a method of irradiating the first laser Laser1 and the second laser Laser2 and a method of measuring the relative positions of the first irradiation area AR2 and the test area AR1-1 may be the same as or similar to those described above.

The above process may be performed in all cells of the first display substrate. In this case, measuring a degree to which the center of the first irradiation area AR2 of each cell deviates from the center of the test area AR1-1 may be performed after forming the first irradiation area AR2 in one cell, or may be performed by forming the first irradiation area AR2 in all of the plurality of cells and then scanning the entire first display substrate.

It may be determined whether the distance between the center of the first irradiation area AR2 and the center of the test area AR1-1 in each cell is within a certain range based on a result measured as described above. In this case, when the distance between the center of the first irradiation area AR2 and the center of the test area AR1-1 in each cell is within a certain range, a position at which the second laser is irradiated to each display substrate D may not be changed.

On the other hand, when it is determined that the distance between the center of the first irradiation area AR2 and the center of the test area AR1-1 in each cell is out of a certain range, the position at which the second laser is irradiated to each display substrate D may be varied. In this case, the first display substrate may be determined to be defective and discarded. In one or more embodiments, when forming the second irradiation area AR3 on a new second display substrate based on the above results, the position of the second laser irradiated to the second display substrate may be adjusted for each cell based on the distance between the center of the first irradiation area AR2 and the center of the test area AR1-1.

In this case, by comparing the positions of only the first irradiation area AR2 and the test area AR1-1, it is possible to check (e.g., accurately check) the irradiation position of each laser through a small amount of data. In one or more embodiments, it is possible to shorten a manufacturing time by performing an actual process and a test process at the same time.

Figure 7:
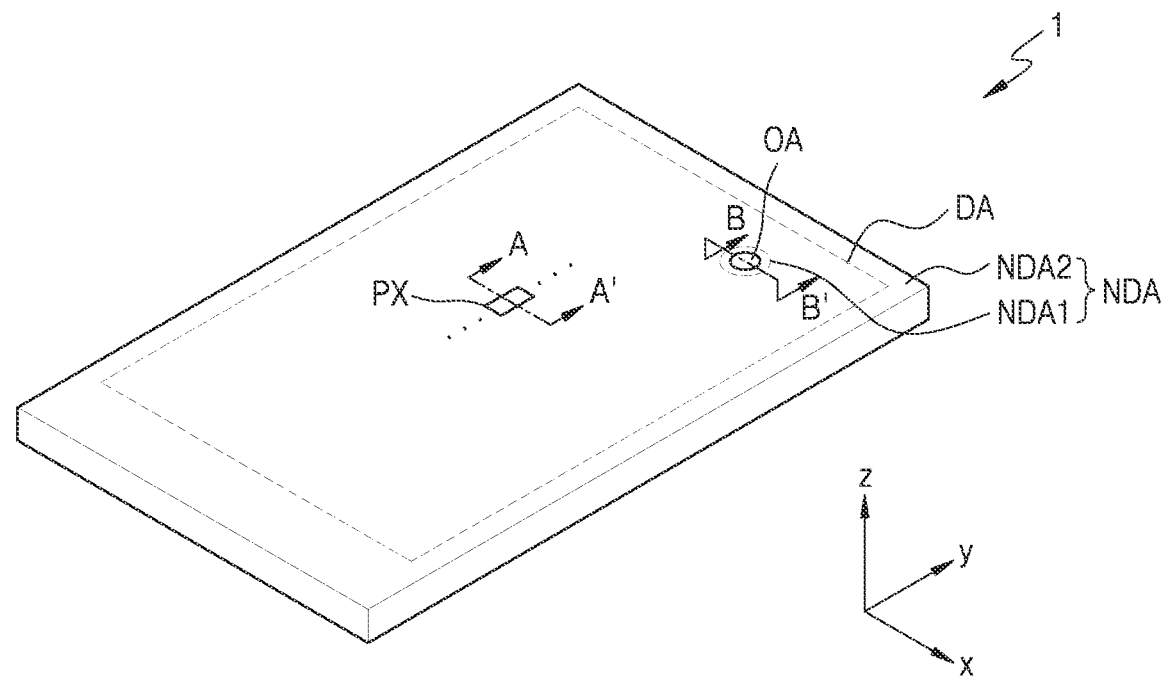
FIG. 7 is a schematic perspective view of a display apparatus according to one or more embodiments.
Figure 8:
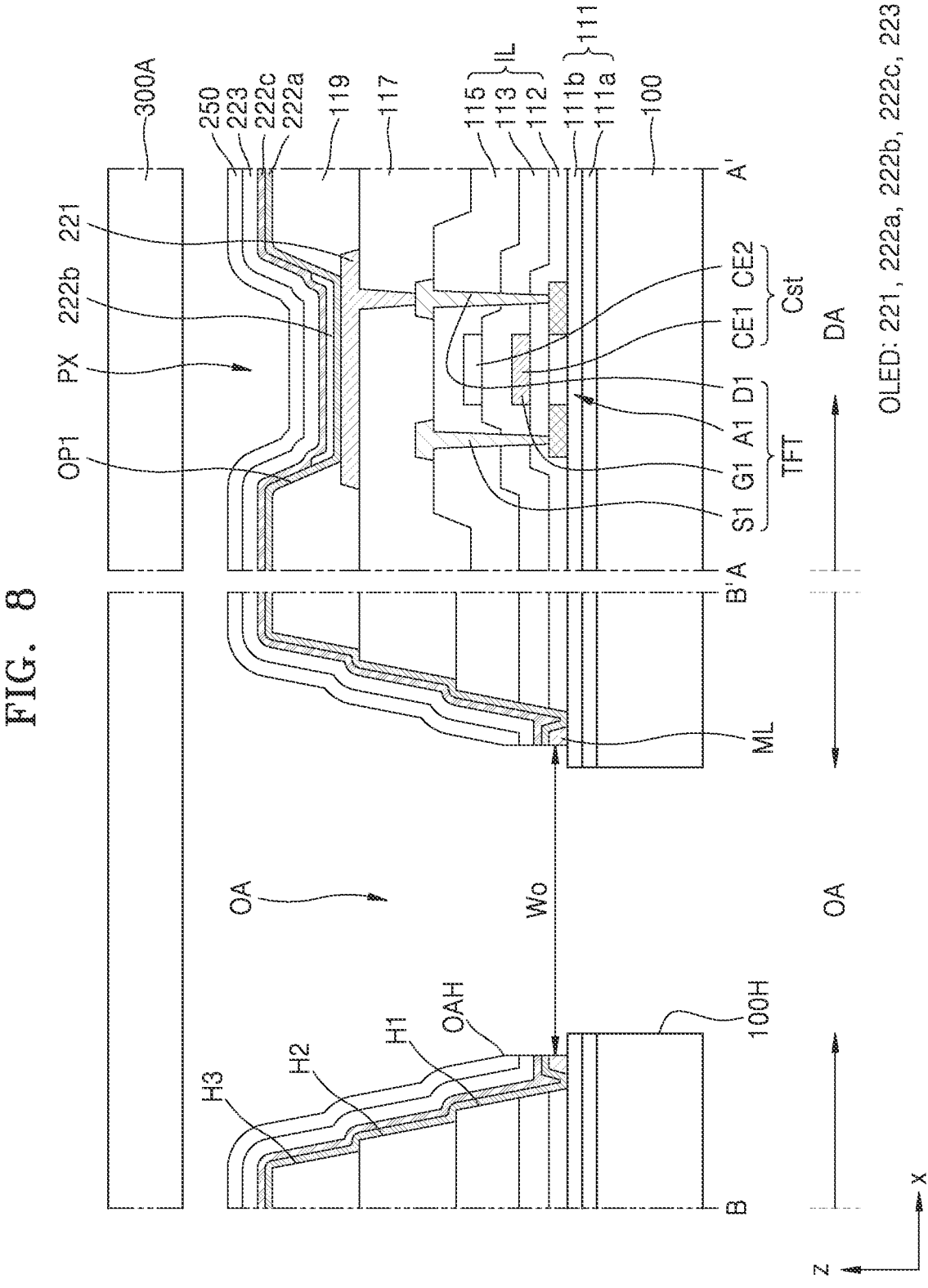
FIG. 8 is a schematic cross-sectional view of the display apparatus, taken along the lines A-A' and B-B' of FIG. 7.

FIG. 7 is a schematic perspective view of a display apparatus 1 according to one or more embodiments. FIG. 8 is a schematic cross-sectional view of the display apparatus 1, taken along the lines A-A' and B-B' of FIG. 7.

Referring to FIGS. 7 and 8, the display apparatus 1 includes a display area DA that emits light, and a peripheral area NDA that does not emit light. The peripheral area NDA is arranged adjacent to the display area DA. The display apparatus 1 may provide a certain image by using light emitted from a plurality of pixels PX arranged in the display area DA.

The display apparatus 1 includes an opening area OA that is at least partially surrounded by the display area DA. As an embodiment, FIG. 7 illustrates that the opening area OA is entirely surrounded by the display area DA. The peripheral area NDA may include a first peripheral area NDA1 around (e.g., surrounding) the opening area OA and a second peripheral area NDA2 around (e.g., surrounding) the outer edge of the display area DA. For example, the first peripheral area NDA1 may entirely surround the opening area OA, the display area DA may entirely surround the first peripheral area NDA1, and the second peripheral area NDA2 may entirely surround the display area DA.

The opening area OA may be an area in which a component is arranged. The opening area OA may be understood as a transmission area through which light and/or sound output from the component to the outside or traveling toward the component from the outside may pass. In an embodiment of the present disclosure, when light transmits through the opening area OA, light transmittance may be about 50% or more, more preferably about 70% or more, about 75% or more, about 80% or more, about 85% or more, or about 90% or more. The opening area OA may be an area in which a display element is not arranged and which may not provide an image. In the present embodiment, the opening area OA may be arranged inside the display area DA, and pixels PX may be arranged to surround the opening area OA.

A hole may be formed in the opening area OA as described above. For example, a hole 100H may be formed in or defined by a substrate 100 to correspond to the opening area OA. In other words, the substrate 100 may have a hole 100H corresponding to the opening area OA.

The display apparatus 1 according to one or more embodiments of the present disclosure may use one or more suitable types (kinds) of display apparatuses such as an organic light-emitting display, an inorganic light-emitting display, and a quantum dot light-emitting display.

The display apparatus 1 as described above may include a display panel. The display panel may include the substrate 100, a thin-film transistor, and an organic light-emitting diode.

The substrate 100 may include a polymer resin. The polymer resin may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), and/or the like. The substrate 100 including polymer resin may have flexible, rollable, or bendable properties. The substrate 100 may have a multilayer structure including a layer including the above-described polymer resin and an inorganic layer.

A buffer layer 111 may be located on the substrate 100 to reduce or block penetration of foreign matter, moisture, and/or external air from below the substrate 100, and may provide a flat surface on the substrate 100. The buffer layer 111 may include an inorganic material such as an oxide or nitride, an organic material, or an organic-inorganic compound, and may have a single-layer or multilayer structure of an inorganic material and an organic material. A barrier layer that blocks penetration of external air may be further included between the substrate 100 and the buffer layer 111. In one or more embodiments, the buffer layer 111 may include silicon oxide ($SiO_2$) or silicon nitride ($SiN_x$). The buffer layer 111 may be provided such that a first buffer layer 111$a$ and a second buffer layer 111$b$ are stacked.

A thin-film transistor TFT may be arranged on the buffer layer 111. The thin-film transistor TFT includes a first semiconductor layer A1, a first gate electrode G1, a first source electrode S1, and a first drain electrode D1. The thin-film transistor TFT may be connected to an organic light-emitting diode OLED of the display area DA to drive the organic light-emitting diode OLED.

The first semiconductor layer A1 may be arranged on the buffer layer 111 and may include polysilicon. In another embodiment, the first semiconductor layer A1 may include amorphous silicon. In another embodiment, the first semiconductor layer A1 may include an oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel region, and a source region and a drain region doped with impurities. The source region and the drain region may be at opposite sides of the channel region.

A first gate insulating layer 112 may be provided to cover the first semiconductor layer A1. The first gate insulating layer 112 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may be ZnO and/or $ZnO_2$. The first gate insulating layer 112 may include single layer or multiple layers including the above-described inorganic insulating material.

The first gate electrode G1 is arranged on the first gate insulating layer 112 to overlap the first semiconductor layer A1. The first gate electrode G1 may include molybdenum (Mo), aluminum (Al), copper (Cu), titanium (Ti), and/or the like, and may include a single layer or multiple layers. For example, the first gate electrode G1 may include a single layer of Mo.

A second gate insulating layer 113 may be provided to cover the first gate electrode G1. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_x$. $ZnO_x$ may be ZnO and/or $ZnO_2$. The second gate insulating layer 113 may include a single layer or multiple layers including the above-describe inorganic insulating material.

A first upper electrode CE2 of a storage capacitor Cst may be arranged on the second gate insulating layer 113.

In the display area DA, the first upper electrode CE2 may overlap the first gate electrode G1 below the first upper electrode CE2. The first gate electrode G1 and the first upper electrode CE2 overlapping each other with the second gate insulating layer 113 therebetween may form the storage capacitor Cst. The first gate electrode G1 may be a first lower electrode CE1 of the storage capacitor Cst.

The first upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may include a single layer or multiple layers including the above-described material.

An interlayer insulating layer 115 may be formed to cover the first upper electrode CE2. The interlayer insulating layer 115 may include $SiO_2$, $SiN_x$, SiON, $Al_2O_3$, $TiO_2$, $Ta_2O_5$, $HfO_2$, $ZnO_x$, and/or the like. $ZnO_x$ may be ZnO and/or $ZnO_2$.

When the first gate insulating layer 112, the second gate insulating layer 113, and the interlayer insulating layer 115 are collectively referred to as an inorganic insulating layer IL, the inorganic insulating layer IL may have a first hole H1 corresponding to the opening area OA. The first hole H1 may be formed to expose the upper surface of the buffer layer 111 (e.g., the second buffer layer 111b) or the substrate 100. The first hole H1 may be formed of a first opening of the first gate insulating layer 112, a second opening of the second gate insulating layer 113, and a third opening of the interlayer insulating layer 115, which are formed to correspond to the opening area OA, and overlap one another. The first to third openings may be separately formed through separate processes or may be concurrently (e.g., simultaneously) formed through the same process. In one or more embodiments, one or more suitable modifications are possible, such as the first opening and the second opening being formed at the same time and the third opening being formed separately. When the first to third openings are formed by separate processes, a step may be formed on the side surface of the first hole H1.

The first source electrode S1 and the first drain electrode D1 are arranged on the interlayer insulating layer 115. The first source electrode S1 and the first drain electrode D1 may each include a conductive material including molybdenum (Mo), aluminum (Al), copper (Cu), titanium (Ti), and/or the like, and may each include multiple layers or a single layer including the conductive material. For example, the first source electrode S1 and the first drain electrode D1 may each have a multilayer structure of Ti/Al/Ti.

A planarization layer 117 may be arranged to cover the first source electrode S1 and the first drain electrode D1. The planarization layer 117 may have a flat upper surface so that a first pixel electrode 221 arranged on the planarization layer 117 may be formed flat.

The planarization layer 117 may include a single layer or multiple layers including an organic material or an inorganic material. The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, and/or the like. The planarization layer 117 may include $SiO_2$, $SiN_x$, SiON, $Al_2O_3$, $TiO_2$, $Ta_2O_5$, $HfO_2$, $ZnO_x$, and/or the like. $ZnO_x$ may be ZnO and/or $ZnO_2$. After the planarization layer 117 is formed, chemical mechanical polishing may be performed to provide a flat top surface.

The planarization layer 117 may have a second hole H2 corresponding to the opening area OA. The second hole H2 may be arranged to overlap (e.g., overlap in a thickness direction of the substrate 100) the first hole H1. Although the drawing shows that the lower width (e.g., the lower width in the x-direction) of the second hole H2 is greater than the lower width (e.g., the lower width in the x-direction) of the first hole H1, the present disclosure is not limited thereto. For example, the planarization layer 117 may be provided to cover the edge of the first hole H1 of the inorganic insulating layer IL, and thus, the width (e.g., the width in the x-direction) of the second hole H2 may be less than the width (e.g., the width in the x-direction) of the first hole H1.

The planarization layer 117 has an opening that exposes one of the first source electrode S1 and the first drain electrode D1 of the thin-film transistor TFT, and the first pixel electrode 221 may contact the first source electrode S1 or the first drain electrode D1 through the opening and be connected (e.g., electrically connected) to the thin-film transistor TFT.

The first pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

In another embodiment, the first pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound or mixture thereof. In another embodiment, the first pixel electrode 221 may further include a layer including ITO, IZO, ZnO, or $In_2O_3$ above or under the above-described reflective layer. In one or more embodiments, the first pixel electrode 221 may have a stacked structure of ITO/Ag/ITO.

A pixel-defining layer 119 may cover an edge of the first pixel electrode 221. The pixel-defining layer 119 overlaps the first pixel electrode 221 and includes a first opening OP1 defining a light-emitting area of a pixel PX. The pixel-defining layer 119 may increase the distance between the edge of the first pixel electrode 221 and an opposite electrode 223 on the first pixel electrode 221, thereby preventing or reducing the occurrence of arcs in the edge of the first pixel electrode 221. The pixel-defining layer 119 may include an organic insulating material such as polyimide, polyamide, acrylic resin, BCB, HMDSO, or phenol resin, and may be formed by spin coating or the like.

The pixel-defining layer 119 may include a third hole H3 located in the opening area OA. The third hole H3 may overlap (e.g., overlap in the thickness direction of the substrate 100) the first hole H1 and the second hole H2. As the first hole H1, the second hole H2, and the third hole H3 are formed, the light transmittance of the opening area OA may be improved. The opposite electrode 223 to be described below may be arranged on inner walls of the first hole H1, the second hole H2, and the third hole H3. The opening area OA may have a transmissive hole OAH corresponding to the opening area OA.

When the transmissive hole OAH corresponds to the opening area OA, it may be understood that the transmissive hole OAH overlaps the opening area OA. In this case, the area of the transmissive hole OAH may be less than the area of the first hole H1 formed in the inorganic insulating layer IL. To this end, in FIG. 8, a width (e.g., a width in the x-direction) Wo of the transmissive hole OAH is illustrated to be less than the width (e.g., the width in the x-direction) of the first hole H1.

A metal layer ML may be arranged in the first hole H1, the second hole H2, and the third hole H3 (e.g., arranged in the first hole H1, the second hole H2, and the third hole H3 in a plan view). The metal layer ML may be arranged to be apart from (e.g., spaced from) the inner wall of the first hole H1. The metal layer ML may be arranged around the transmissive hole OAH.

The metal layer ML may include one or more suitable metals. In one or more embodiments, the metal layer ML may be concurrently (e.g., simultaneously) formed of the same material as the first pixel electrode 221. In one or more embodiments, the metal layer ML may have a stacked structure of ITO/Ag/ITO. However, the present disclosure is not limited thereto. In another embodiment, the metal layer ML may be concurrently (e.g., simultaneously) formed of the same material as the first gate electrode G1, the first source electrode S1, or the first drain electrode D1.

A first functional layer 222a is arranged to cover the pixel-defining layer 119. The first functional layer 222a may include a single layer or multiple layers. The first functional layer 222a may be a hole transport layer (HTL) having a single-layered structure. In one or more embodiments, the first functional layer 222a may include a hole injection layer (HIL) and an HTL. The first functional layer 222a may be integrally formed to correspond to the pixels PX included in the display area DA.

A first emission layer 222b formed to correspond to the first pixel electrode 221 is arranged on the first functional layer 222a. The first emission layer 222b may include a high molecular material or a low molecular material, and may be to emit red, green, blue, or white light.

A second functional layer 222c may be formed on the first emission layer 222b. The second functional layer 222c may include a single layer or multiple layers. The second functional layer 222c may include an electron transport layer (ETL) and/or an electron injection layer (EIL). The second functional layer 222c may be integrally formed to correspond to the pixels PX included in the display area DA. The first functional layer 222a and/or the second functional layer 222c may not be provided.

The opposite electrode 223 is arranged on the second functional layer 222c. The opposite electrode 223 may include a conductive material having a low work function. For example, the opposite electrode 223 may be a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In one or more embodiments, the opposite electrode 223 may further include a layer including ITO, IZO, ZnO, or $In_2O_3$ on the (semi) transparent layer including the above-described material. The opposite electrode 223 may be integrally formed to correspond to the pixels PX included in the display area DA.

Layers from the first pixel electrode 221 to the opposite electrode 223, which are formed in the display area DA, may form a organic light-emitting diode OLED.

A capping layer 250 may be formed on the opposite electrode 223. The capping layer 250 may include LiF. In one or more embodiments, the capping layer 250 may include an inorganic insulating material such as silicon nitride, and/or an organic insulating material. In one or more embodiments, the capping layer 250 may not be provided.

In one or more embodiments, the first functional layer 222a, the second functional layer 222c, the opposite electrode 223, and the capping layer 250 may be arranged on the sides of the first hole H1, the second hole H2, and the third hole H3.

The organic light-emitting diode OLED may be covered with an encapsulation substrate 300A. The encapsulation substrate 300A includes a transparent material. For example, the encapsulation substrate 300A may include a glass material. In one or more embodiments, the encapsulation substrate 300A may include a polymer resin and/or the like. The encapsulation substrate 300A may prevent or substantially prevent external moisture or foreign matter from penetrating into the organic light-emitting diode OLED.

A sealing material such as a sealant may be arranged between the substrate 100, on which the organic light-emitting diode OLED is formed, and the encapsulation substrate 300A. The sealing material may block or substantially block external moisture or foreign matter that may penetrate through between the substrate 100 and the encapsulation substrate 300A.

FIGS. 9A to 9D are cross-sectional views illustrating a method of manufacturing a display apparatus according to one or more embodiments.

Referring to FIGS. 9A to 9D, a display substrate D may be manufactured by forming a thin-film transistor and an organic light-emitting diode on a substrate 100. In this case, a process of manufacturing the display substrate D may be performed while the substrate 100 is arranged on a carrier substrate CR. The carrier substrate CR may include a glass material, and may prevent or substantially prevent the display substrate D from being bent or wrinkled during processing.

As described above, the display substrate D may include a plurality of cells as described above. In this case, the plurality of cells may be arranged to be spaced from each other.

In this case, when a thin-film transistor and an organic light-emitting diode are formed on the substrate 100, a pre-metal layer PML may also be formed. In this case, the pre-metal layer PML is formed in a first hole H1 of an inorganic insulating layer IL. The pre-metal layer PML may include a first pre-metal layer PML-c and a second pre-metal layer PML-e. The first pre-metal layer PML-c and the second pre-metal layer PML-e may be spaced from each other. In another embodiment, the first pre-metal layer PML-c and the second pre-metal layer PML-e may be at least partially connected to each other. The first pre-metal layer PML-c may be formed to correspond to most of a transmission portion TA. The second pre-metal layer PML-e may refer to an edge region of the pre-metal layer PML arranged to surround the first pre-metal layer PML-c.

The pre-metal layer PML may include a metal such as silver (Ag), aluminum (Al), platinum (Pt), palladium (Pd), gold (Au), nickel (Ni), molybdenum (Mo), or titanium (Ti). In one or more embodiments, the pre-metal layer PML may further include a layer including ITO, IZO, ZnO, or $In_2O_3$ on/under the above-described metal material. In an embodiment, the pre-metal layer PML may be concurrently (e.g., simultaneously) formed of the same material as pixel electrodes 221.

A first functional layer 222a, a second functional layer 222c, an opposite electrode 223, and a capping layer 250, which are integrally formed in a display area DA and an opening area OA, are sequentially formed on the pre-metal layer PML.

In this case, in one or more embodiments, a test metal layer may be formed in a test area together with the pre-metal layer PML. In this case, pre-metal layers PML may be arranged to be spaced from each other, and may be arranged along the edge of the opening area OA. In this case, the opening area OA may have a shape and size corresponding to the processing area shown in FIG. 3.

When the above process is completed, by placing the display substrate D in the apparatus 2 for manufacturing the display apparatus, shown in FIG. 1, and irradiating a first laser Laser1 and a second laser Laser2, a first irradiation area AR2 may be formed in the test area AR1-1 and a second irradiation area AR3 may be formed in the processing area.

For example, after the first irradiation area AR2 is formed by irradiating a first laser Laser1 to the test area AR1-1, as described above, the relative positions of the first irradiation area AR2 and the test area AR1-1 may be measured to irradiate the second laser Laser2 to the second irradiation area AR3. In this case, the second laser Laser2 may be irradiated in an annular shape to the processing area AR1, as described above. For example, laser light LP may travel in the z-direction from the lower surface of the substrate 100 and be irradiated to the lower surface of the pre-metal layer PML. The laser light LP may have an infrared wavelength. When the laser light LP is infrared, the transmittance of the substrate 100 and the buffer layer 111 may be about 80% to about 90% or more, and thus, the laser light LP may efficiently reach the pre-metal layer PML.

Because the pre-metal layer PML includes an opaque metal, the pre-metal layer PML may absorb the laser light LP. Accordingly, thermal expansion of the pre-metal layer PML may occur, and thus, the pre-metal layer PML irradiated with the laser light LP may be lifted off from the substrate 100 or the buffer layer 111.

Figure 9A:
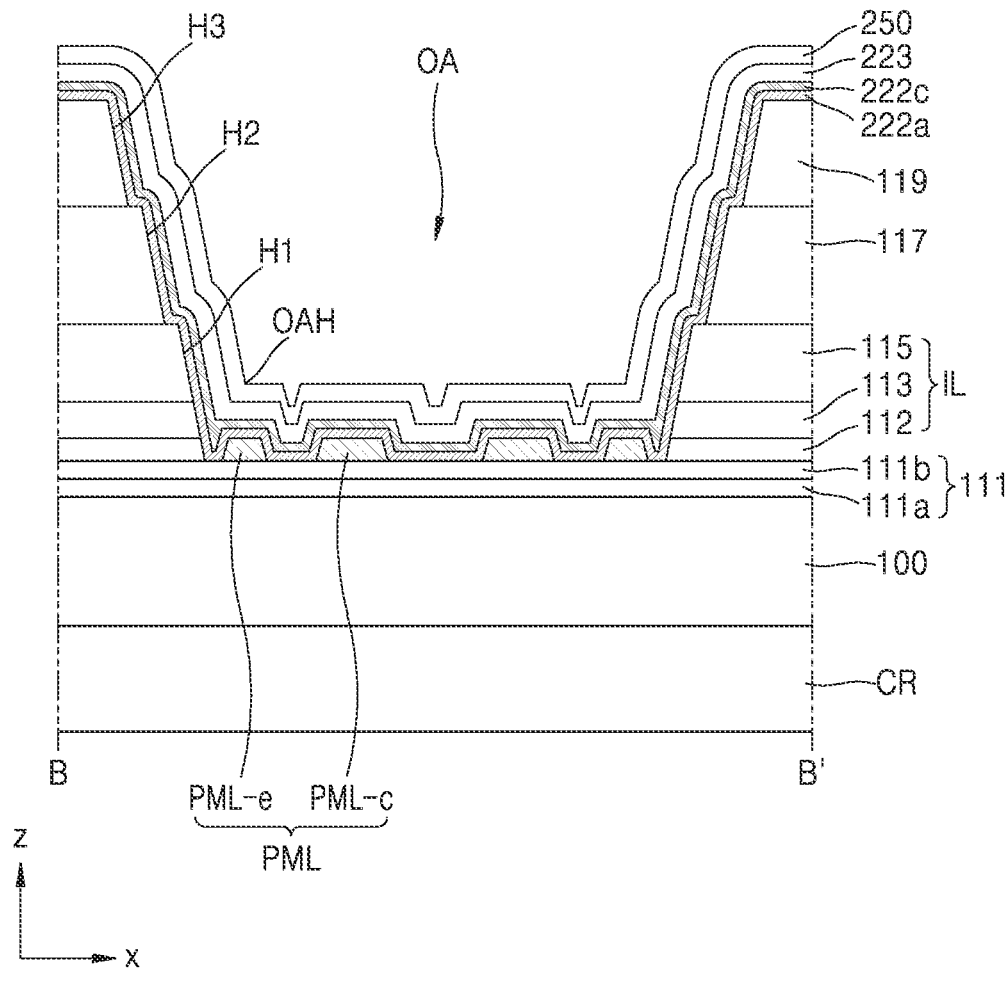
FIGS. 9A to 9D are cross-sectional views illustrating a method of manufacturing a display apparatus according to one or more embodiments.
Figure 9B:
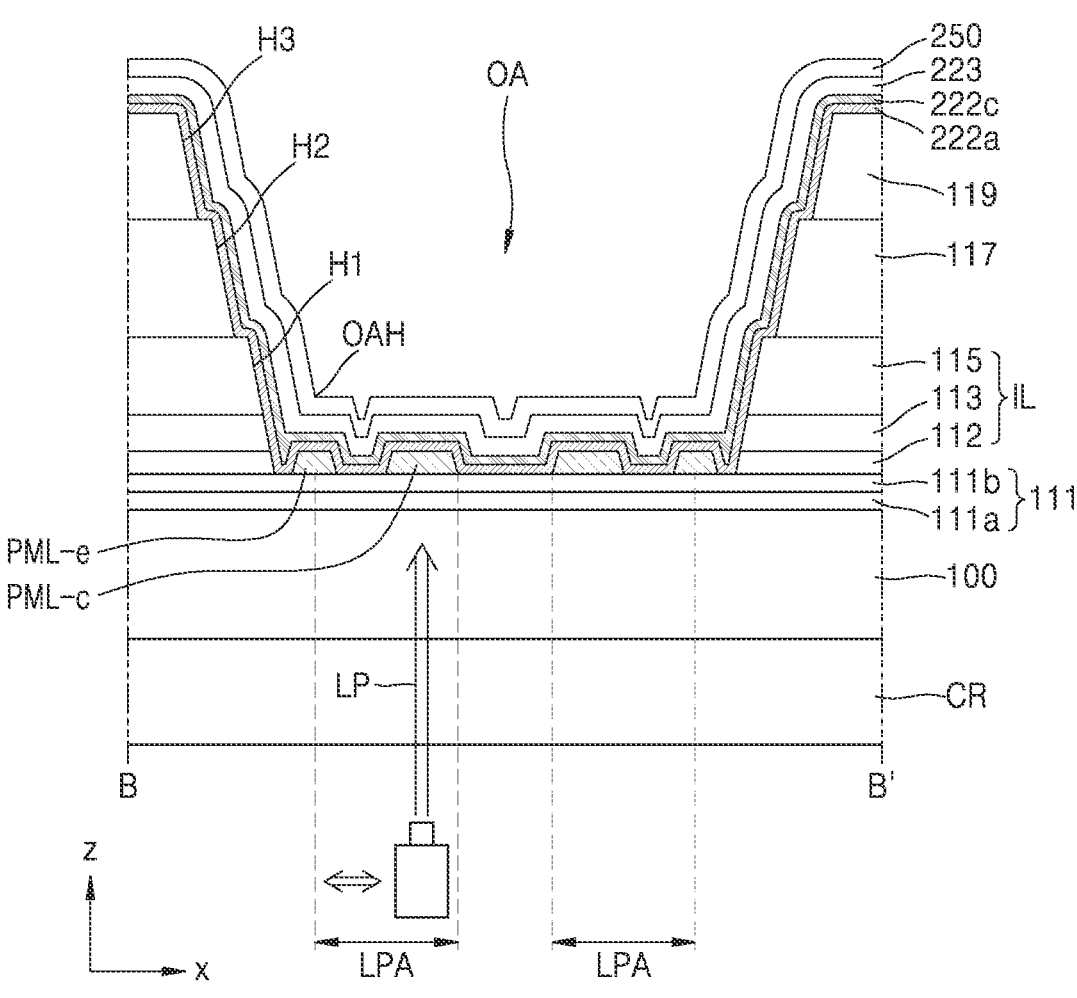
Figure 9C:
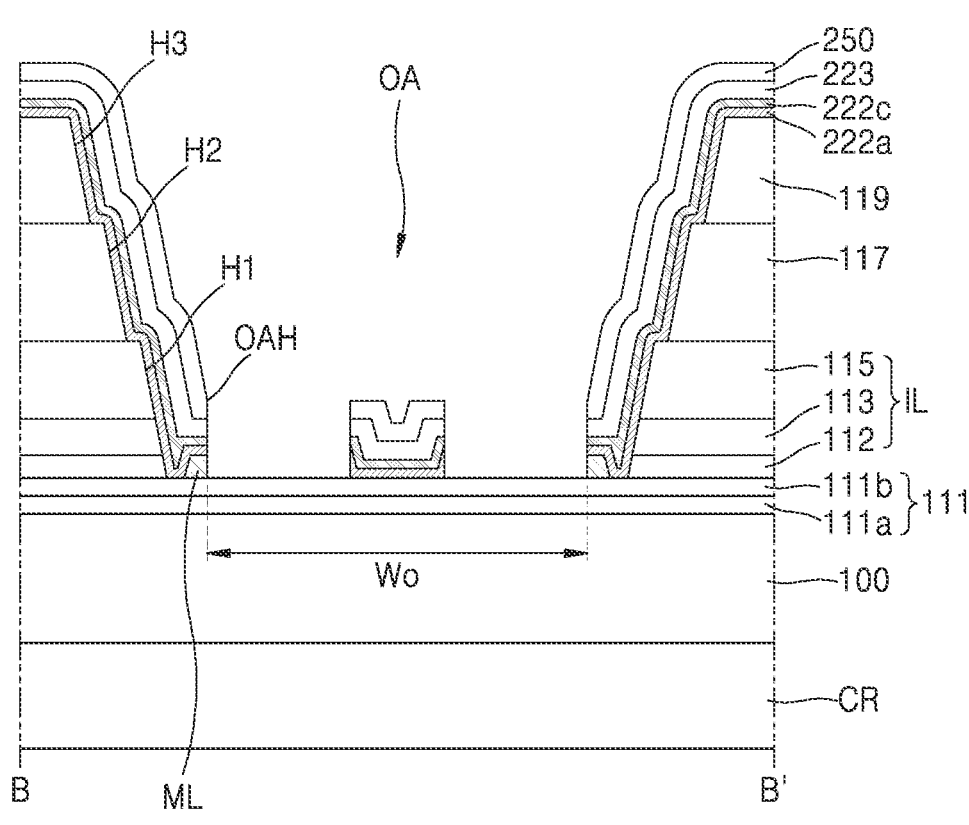
Figure 9C:
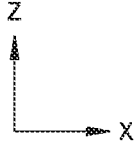
Figure 9D:
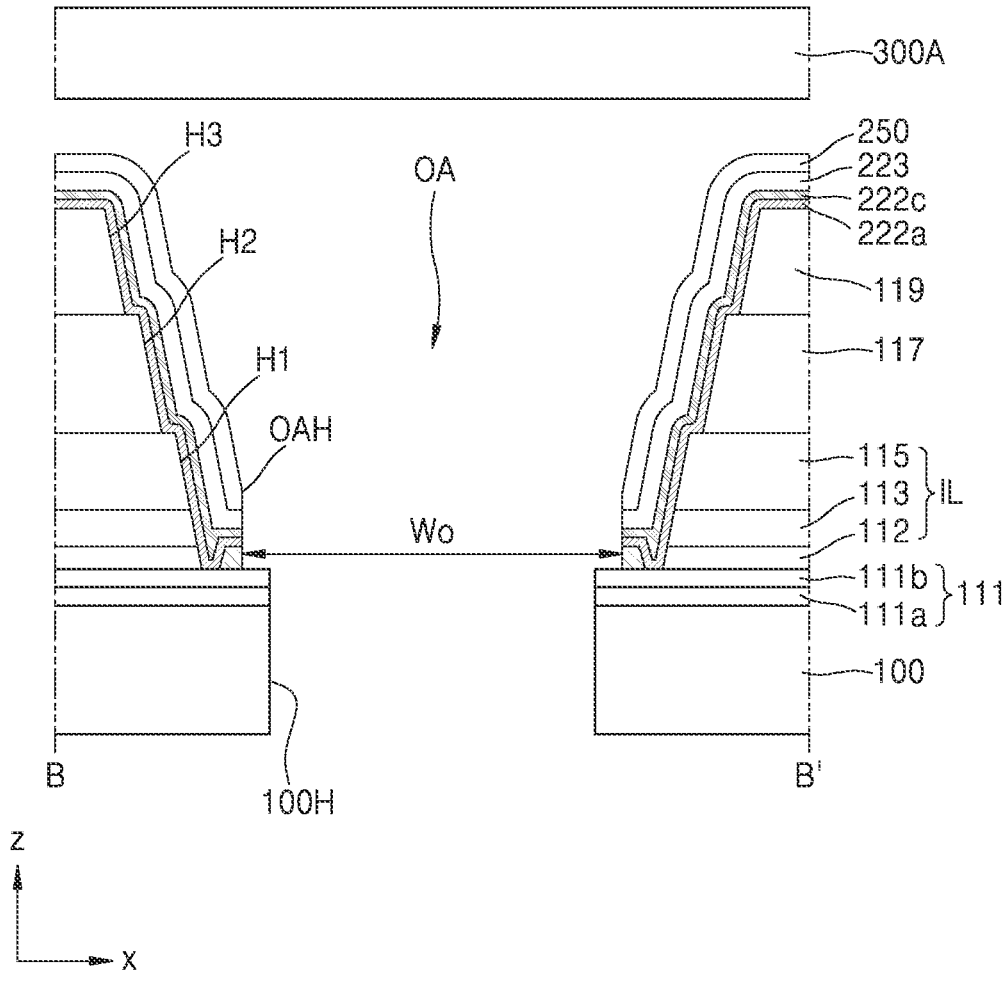

As a part of the pre-metal layer PML is lifted off, the first functional layer 222a, the second functional layer 222c, the opposite electrode 223, and the capping layer 250, which are arranged on the pre-metal layer PML that is lifted off, may also be removed along with the pre-metal layer PML. Accordingly, as shown in FIG. 9C, the first pre-metal layer PML-c of the pre-metal layer PML may be removed, and a metal layer ML configured of a part of the second pre-metal layer PML-e may be formed.

When the above process is completed, the display substrate D on the carrier substrate CR may be withdrawn from the apparatus 2 for manufacturing the display apparatus, shown in FIG. 1. After the carrier substrate CR is separated from the substrate 100, each cell of the display substrate D may be separated, and an encapsulation substrate 300A may be arranged to face the substrate 100, and the substrate 100 and the encapsulation substrate 300A may be attached to each other with a sealing member to seal the organic light-emitting diode. In this case, a sealing member may be separately arranged outside the edge of the opening area OA to block or reduce oxygen and moisture flowing from a hole 100H formed in the substrate 100. As another embodiment, a plurality of cells may be separated from each other after the organic light-emitting diode is sealed through the sealing member and the encapsulation substrate 300A without separating each cell after the carrier substrate CR is separated from the substrate 100. In this case, a method of separating the plurality of cells may be a method of forming a cutting line between adjacent cells and then applying energy along the cutting line by using a laser, a knife, and/or the like.

The hole 100H may be formed in or be defined by the substrate 100 as described above. In this case, the hole 100H may be formed before the plurality of cells are separated from each other. Also, the hole 100H may be formed after the organic light-emitting diode is sealed with the encapsulation substrate 300A and the sealing member.

When the hole 100H is formed as described above, the hole 100H may be formed to have a shape corresponding to the processing area AR1 or smaller than the processing area AR1. Also, the edge of the hole 100H may be arranged inside the second irradiation area AR3.

In the above case, because the method of manufacturing a display apparatus may precisely form the second irradiation area AR3, the hole 100H may be formed at an accurate position.

Figure 10:
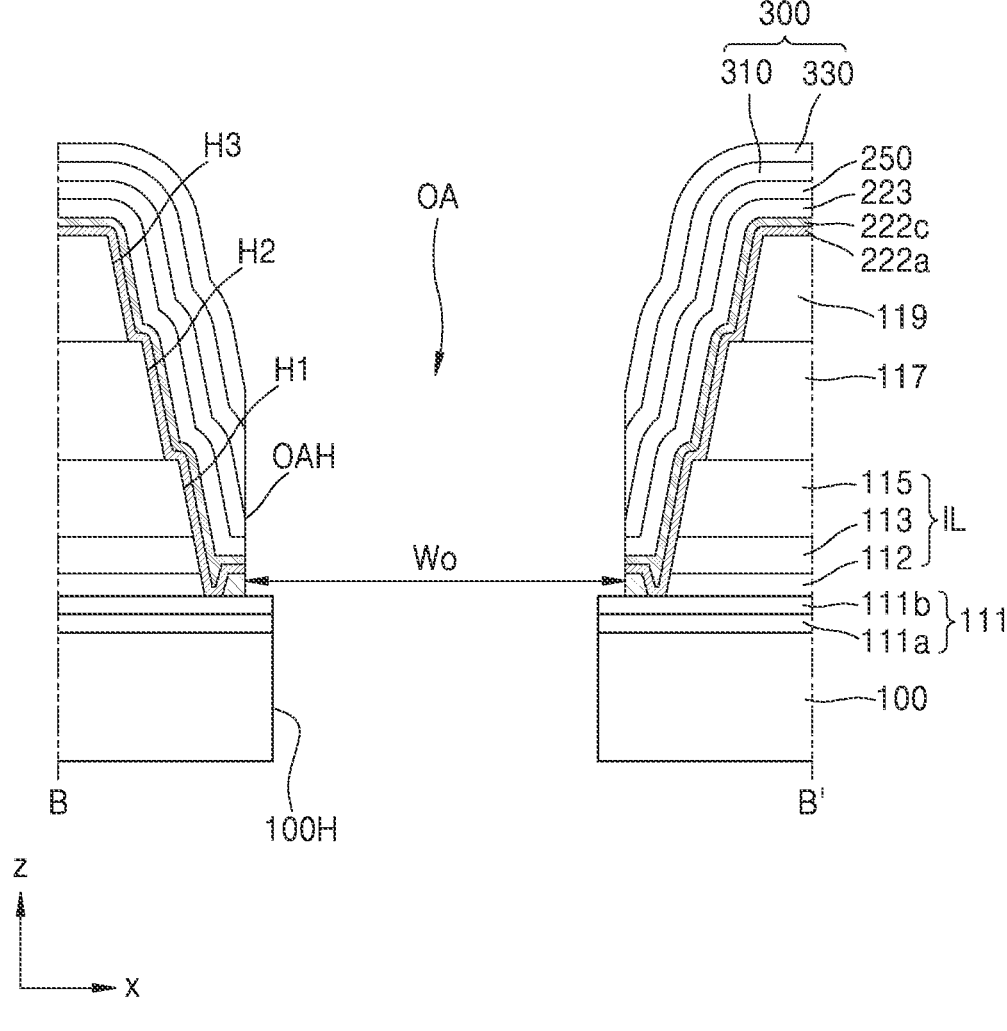
FIG. 10 is a schematic cross-sectional view of a display apparatus according to one or more embodiments.

FIG. 10 is a schematic cross-sectional view of a display apparatus 1 according to one or more embodiments.

Referring to FIG. 10, the display apparatus 1 may include a display panel. In this case, the display panel may be the same as or similar to that described with reference to FIGS. 8 and 9D. Hereinafter, details different from those shown in FIGS. 8 and 9D will be described in more detail.

The display panel may include a thin-film encapsulation layer 300 instead of an encapsulation substrate and a sealing member. The thin-film encapsulation layer 300 may include at least one inorganic encapsulation layer and at least one organic encapsulation layer. In this regard, FIG. 10 shows first and second inorganic encapsulation layers 310 and 330 and an organic encapsulation layer (Not show) therebetween.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and/or silicon oxynitride. The organic encapsulation layer may include a polymer-based material. Examples of the polymer-based material may include acryl-based resin, epoxy-based resin, polyimide, and/or polyethylene.

Figure 11:
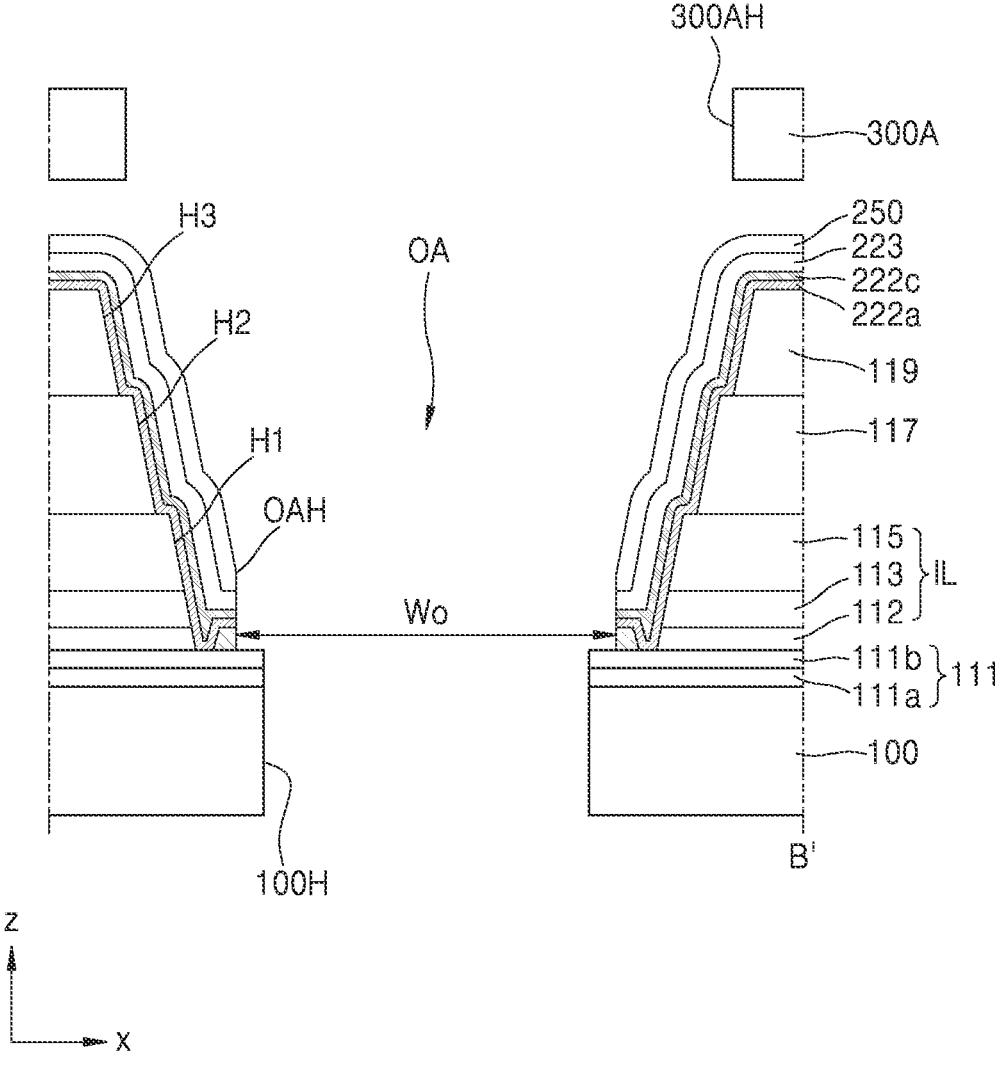
FIG. 11 is a schematic cross-sectional view of a display apparatus according to one or more embodiments.

FIG. 11 is a schematic cross-sectional view of a display apparatus 1 according to one or more embodiments.

Referring to FIG. 11, the display apparatus 1 may include a display panel. In this case, the display panel may be the same as or similar to that described with reference to FIGS. 8 and 9D. Hereinafter, details different from those shown in FIGS. 8 and 9D will be described in more detail.

An encapsulation substrate 300A may include an encapsulation substrate hole 300AH. The encapsulation substrate hole 300AH may be formed concurrently (e.g., simultaneously) when a hole 100H of a substrate 100 is formed. As another embodiment, after the encapsulation substrate hole 300AH is formed during the manufacturing of the encapsulation substrate 300A, the encapsulation substrate 300A may be arranged on the substrate 100 so that the encapsulation substrate hole 300AH and the hole 100H correspond to each other, and the encapsulation substrate 300A may be coupled to the substrate 100 by a sealing member.

Figure 12:
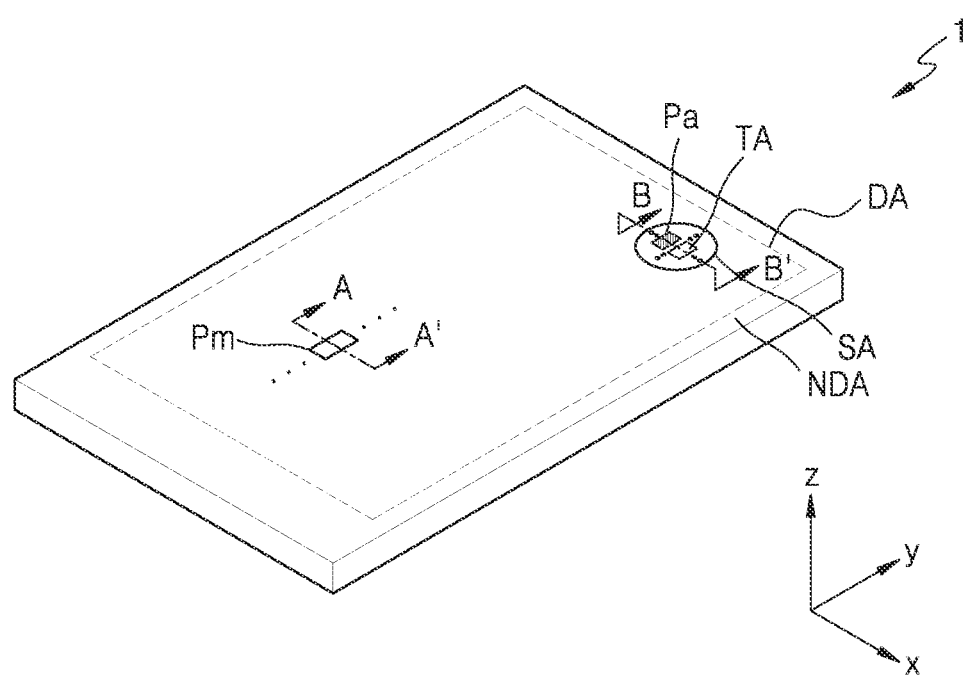
FIG. 12 is a schematic perspective view of a display apparatus according to one or more embodiments.

FIG. 12 is a schematic perspective view of a display apparatus 1 according to one or more embodiments.

Referring to FIG. 12, the display apparatus 1 includes a display area DA that implements or displays an image, and a peripheral area NDA that does not implement or display an image. The display apparatus 1 may provide a main image by using light emitted from a plurality of main pixels Pm arranged in the display area DA.

The display apparatus 1 includes a component area SA. As described below with reference to FIG. 12, the component area SA may be an area in which a component such as a sensor using infrared, visible light, and/or sound is arranged. The component area SA may include a transmission portion TA through which light and/or sound output from the component or traveling from the outside toward the component may pass. In an embodiment of the present disclosure, when infrared rays transmit through the component area SA, the infrared transmittance of the entire component area SA may be about 10% or more, more preferably about 20% or more, about 25% or more, about 50% or more, about 85% or more, or about 90% or more.

In the present embodiment, a plurality of auxiliary pixels Pa may be arranged in the component area SA, and a certain image may be provided using light emitted from the plurality of auxiliary pixels Pa. An image provided from the component area SA may have a lower resolution than an image provided from the display area DA, as an auxiliary image. For example, because the component area SA includes a transmission portion PA through which light and/or sound may pass, the number of auxiliary pixels Pa that may be arranged per unit area may be less than the number of main pixels Pm arranged in the display area DA per unit area.

The component area SA may be at least partially surrounded by the display area DA, and as an example embodiment, FIG. 12 illustrates that the component area SA is entirely surrounded by the display area DA.

Hereinafter, an organic light-emitting display will be described as the display apparatus 1 according to one or more embodiments, but the display apparatus of the present disclosure is not limited thereto. As another embodiment, one or more suitable types (kinds) of display apparatuses such as an inorganic light-emitting display and a quantum dot light-emitting display may be used.

Although FIG. 12 illustrates that the component area SA is arranged on one side (i.e., an upper right side) of the display area DA which is rectangular, the present disclosure is not limited thereto. The shape of the display area DA may be a circle, an ellipse, or a polygon such as a triangle or a pentagon, and the position of the component area SA and the number of component areas SA may be variously changed.

Figure 13:
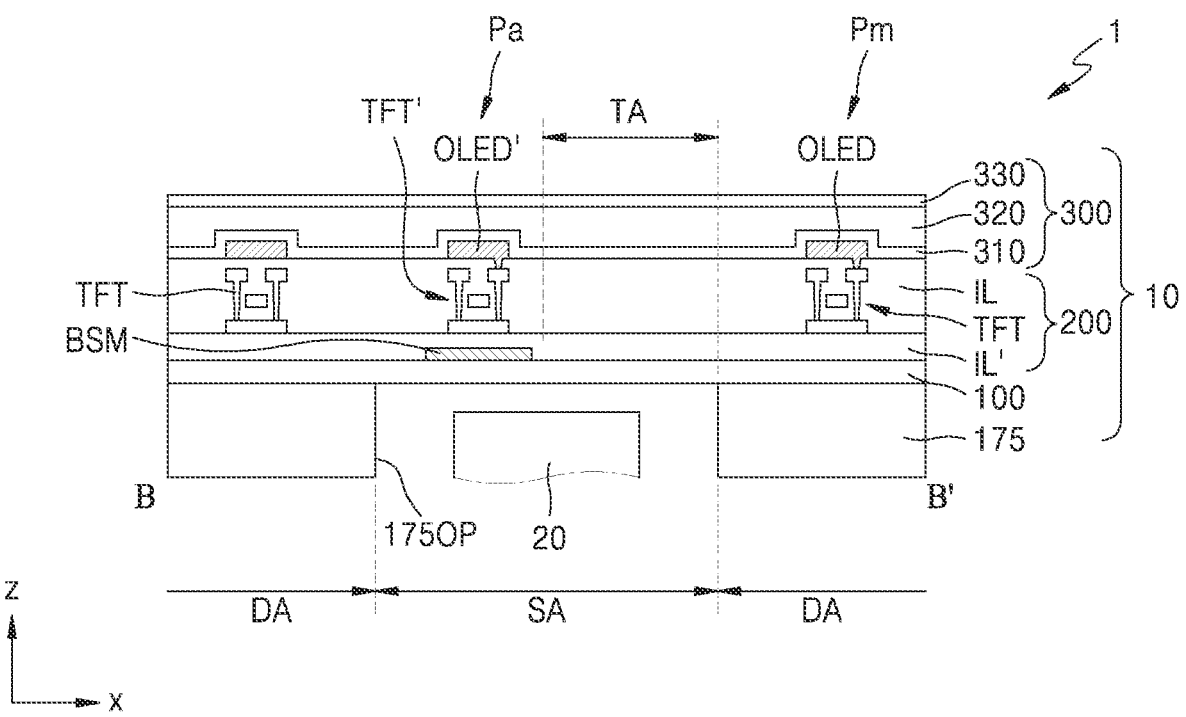
FIG. 13 is a schematic cross-sectional view of the display apparatus, taken along the line B-B' of FIG. 12.

FIG. 13 is a schematic cross-sectional view of a display apparatus 1 according to one or more embodiments, and may correspond to a cross-section of the display apparatus taken along the line B-B' of FIG. 12.

Referring to FIG. 13, the display apparatus 1 may include a display panel 10 including a display element and a component 20 corresponding to a component area SA.

The display panel 10 may include a substrate 100, a display element layer 200 arranged on the substrate 100, and a thin-film encapsulation layer 300 as a sealing member for sealing the display element layer 200. In one or more embodiments, the display panel 10 may further include a lower protective layer 175 arranged below the substrate 100.

The substrate 100 may include a polymer resin. When the substrate 100 includes a polymer resin, the substrate 100 may have flexible, rollable, or bendable properties. The substrate 100 may have a multilayer structure including a layer including a polymer resin and an inorganic layer.

The display element layer 200 may include a circuit layer including thin-film transistors TFT and TFT', an organic light-emitting diode OLED as a display element, and insulating layers IL and IL'.

A main pixel Pm including a main thin-film transistor TFT and a main organic light-emitting diode OLED connected thereto may be arranged in the display area DA, and an auxiliary pixel Pa including an auxiliary thin-film transistor TFT' and an auxiliary organic light-emitting diode OLED' connected thereto, and wiring lines WL may be arranged in the component area SA.

In one or more embodiments, the auxiliary thin-film transistor TFT' and a transmission portion TA in which the display element is not arranged may be arranged in the component area SA. The transmission portion TA may be understood as a region through which light/signal emitted from the component 20 or light/signal incident to the component 20 are transmitted.

The component 20 may be located in the component area SA. The component 20 may be an electronic element using light or sound. For example, the component 20 may be a sensor that receives and uses light, such as an infrared sensor, a sensor that outputs and senses light or sound to measure a distance or recognizes a fingerprint and/or the like, a small lamp that outputs light, a speaker that outputs a sound, and/or the like. An electronic element using light may use light in one or more suitable wavelength bands, such as visible light, infrared light, and ultraviolet light. A plurality of components 20 may be arranged in the component area SA. For example, as the component 20, a light-emitting device and a light-receiving device may be provided together in one component area SA. In one or more embodiments, both a light-emitting portion and a light-receiving portion may be provided in one component 20.

A lower electrode layer BSM may be arranged in the component area SA, and the lower electrode layer BSM may be arranged to correspond to the auxiliary pixel Pa. For example, the lower electrode layer BSM may be arranged to correspond to a lower portion of the auxiliary thin-film transistor TFT'. The lower electrode layer BSM may prevent or substantially prevent external light from reaching the auxiliary pixel Pa including the auxiliary thin-film transistor TFT' and/or the like. For example, the lower electrode layer BSM may prevent or substantially prevent light emitted from the component 20 from reaching the auxiliary pixel Pa. A constant voltage or a signal may be applied to the lower electrode layer BSM to prevent or substantially prevent damage to a pixel circuit due to electrostatic discharge.

The thin-film encapsulation layer 300 may include at least one inorganic encapsulation layer and at least one organic encapsulation layer. In this regard, FIG. 13 illustrates first and second inorganic encapsulation layers 310 and 330 and an organic encapsulation layer 320 therebetween.

Each of the first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include acryl-based resin, epoxy-based resin, polyimide, polyethylene, and/or the like.

The lower protective layer 175 may be attached to a lower portion of the substrate 100 to support and protect the substrate 100. The lower protective layer 175 may have an opening 1750P corresponding to the component area SA. By providing the opening 1750P in the lower protective layer 175, the light transmittance of the component area SA may be improved. The lower protective layer 175 may include PET or polyimide.

An area of the component area SA may be greater than an area in which the component 20 is arranged. Accordingly, the area of the opening 1750P provided in the lower protective layer 175 may not match the area of the component area SA. For example, the area of the opening 1750P may be less than the area of the component area SA.

In one or more embodiments, components such as an input sensing member for sensing a touch input, an antireflection member including a polarizer and a retarder or a color filter and a black matrix, and a transparent window may be further arranged on the display panel 10.

Although the thin-film encapsulation layer 300 is used as an encapsulation member for sealing the display element layer 200 in the present embodiment, the present disclosure is not limited thereto. For example, as a member for sealing the display element layer 200, a sealing substrate bonded to the substrate 100 by a sealant or a frit may be used.

Figure 14:
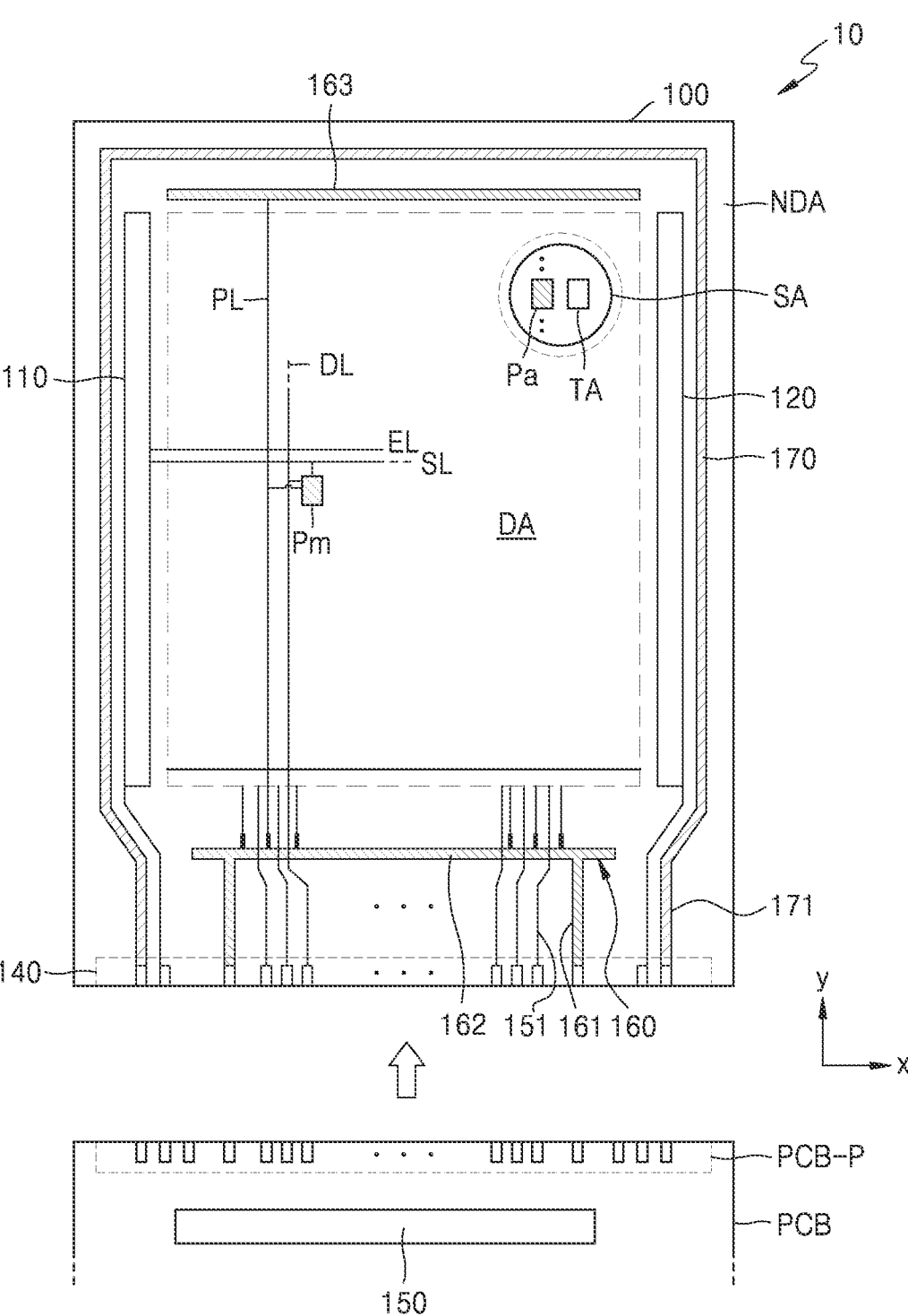
FIG. 14 is a schematic plan view of a display panel illustrated in FIG. 12.

FIG. 14 is a schematic plan view of a display panel 10 according to one or more embodiments.

Referring to FIG. 14, the display panel 10 is arranged in a display area DA and includes a plurality of main pixels Pm. Each of the main pixels Pm may include a display element such as an organic light-emitting diode. Each main pixel Pm may emit, for example, red light, green light, blue light, or white light through the organic light-emitting diode. As described above, the main pixel Pm in the present specification may be understood as a pixel emitting light of any one color among red, green, blue, and white. The display area DA may be covered with the encapsulation member described above with reference to FIG. 13 to be protected from external air or moisture.

A component area SA may be arranged inside the display area DA, and a plurality of auxiliary pixels Pa are arranged in the component area SA. Each of the auxiliary pixels Pa may include a display element such as an organic light-emitting diode. Each auxiliary pixel Pa may emit, for example, red light, green light, blue light, or white light through the organic light-emitting diode. As described above, the auxiliary pixel Pa in the present specification may be understood as a pixel emitting light of any one color among red, green, blue, and white. A transmission portion TA arranged between the auxiliary pixels Pa may be provided in the component area SA.

In an embodiment, one main pixel Pm and one auxiliary pixel Pa may include the same pixel circuit. However, the present disclosure is not limited thereto. A pixel circuit included in the main pixel Pm and a pixel circuit included in the auxiliary pixel Pa may be different from each other.

Because the component area SA includes the transmission portion TA, the resolution of the component area SA may be lower than that of the display area DA. For example, the resolution of the component area SA may be about ½ that of the display area DA. In one or more embodiments, the resolution of the display area DA may be 400 ppi or more, and the resolution of the component area SA may be about 200 ppi.

Each of the main and auxiliary pixels Pm and Pa may be connected (e.g., electrically connected) to external circuits arranged in a non-display area. In the peripheral area NDA, a first scan driving circuit 110, a second scan driving circuit 120, a terminal 140, a data driving circuit 150, a first power supply line 160, and a second power supply line 170 may be arranged.

The first scan driving circuit 110 may provide a scan signal to each of the main and auxiliary pixels Pm and Pa through a scan line SL. The first scan driving circuit 110 may provide an emission control signal to each pixel through an emission control line EL. The second scan driving circuit 120 may be arranged in parallel with the first scan driving circuit 110 with the display area DA therebetween. Some of the main and auxiliary pixels Pm and Pa arranged in the display area DA may be connected (e.g., electrically connected) to the first scan driving circuit 110, and others may be connected to the second scan driving circuit 120. In another embodiment, the second scan driving circuit 120 may not be provided.

The terminal 140 may be arranged on one side of the substrate 100. The terminal 140 may be exposed without being covered by an insulating layer and be connected (e.g., electrically connected) to a printed circuit board PCB. A terminal PCB-P of the printed circuit board PCB may be connected (e.g., electrically connected) to the terminal 140 of the display panel 10. The printed circuit board PCB transmits a signal or power from a controller to the display panel 10. A control signal generated by the controller may be transmitted to the first and second scan driving circuits 110 and 120 through the printed circuit board PCB. The controller may provide a first power supply voltage and a second power supply voltage to the first power supply line 160 and the second power supply line 170 through a first connection line 161 and a second connection line 171, respectively. The first power supply voltage that is a driving voltage may be provided to each main pixel Pm and each auxiliary pixel Pa through a driving voltage line PL connected to the first power supply line 160, and the second power supply voltage may be provided to opposite electrodes of each main pixel Pm and each auxiliary pixel Pa each connected to the second power supply line 170.

The data driving circuit 150 is connected (e.g., electrically connected) to a data line DL. A data signal of the data driving circuit 150 may be provided to each of the main and auxiliary pixels Pm and Pa through the connection line 151 connected to the terminal 140 and the data line DL connected to the connection line 151. FIG. 14 illustrates that the data driving circuit 150 is arranged on the printed circuit board PCB, but in another embodiment, the data driving circuit 150 may be arranged on the substrate 100. For example, the data driving circuit 150 may be arranged between the terminal 140 and the first power supply line 160.

The first power supply line 160 may include a first sub line 162 and a second sub line 163, which extend in parallel in the x direction with the display area DA therebetween. The second power supply line 170 may partially surround the display area DA in a loop shape with one side open.

Figure 15:
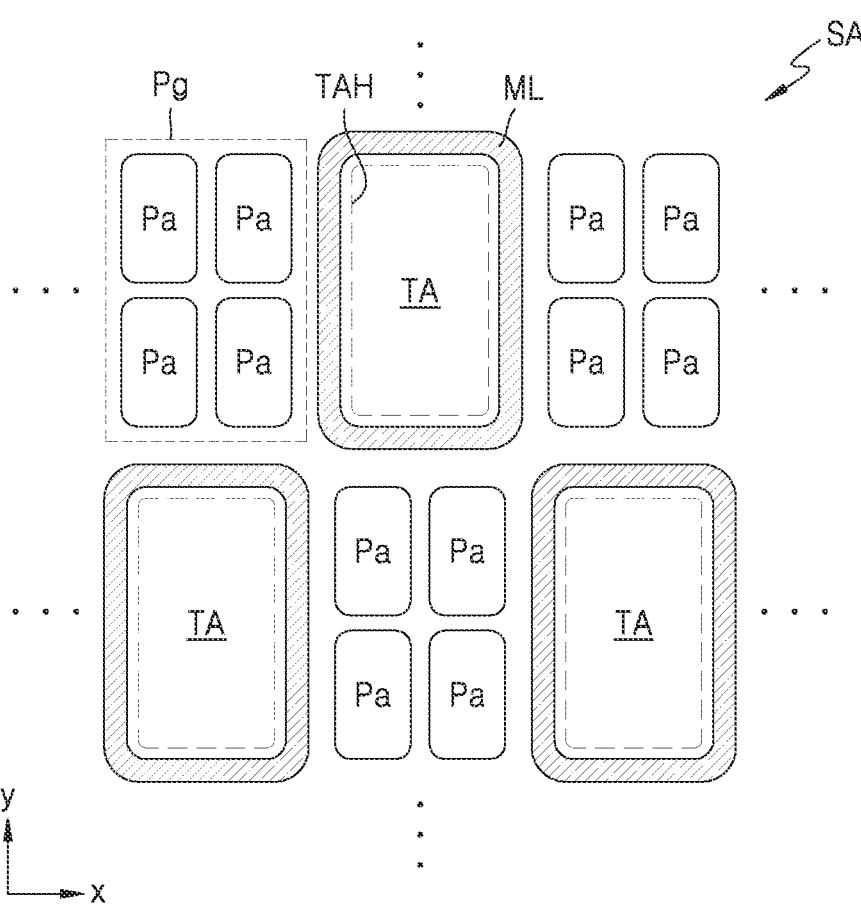
FIG. 15 is a schematic plan view of a part of a component area in FIG. 12.
Figure 16A:
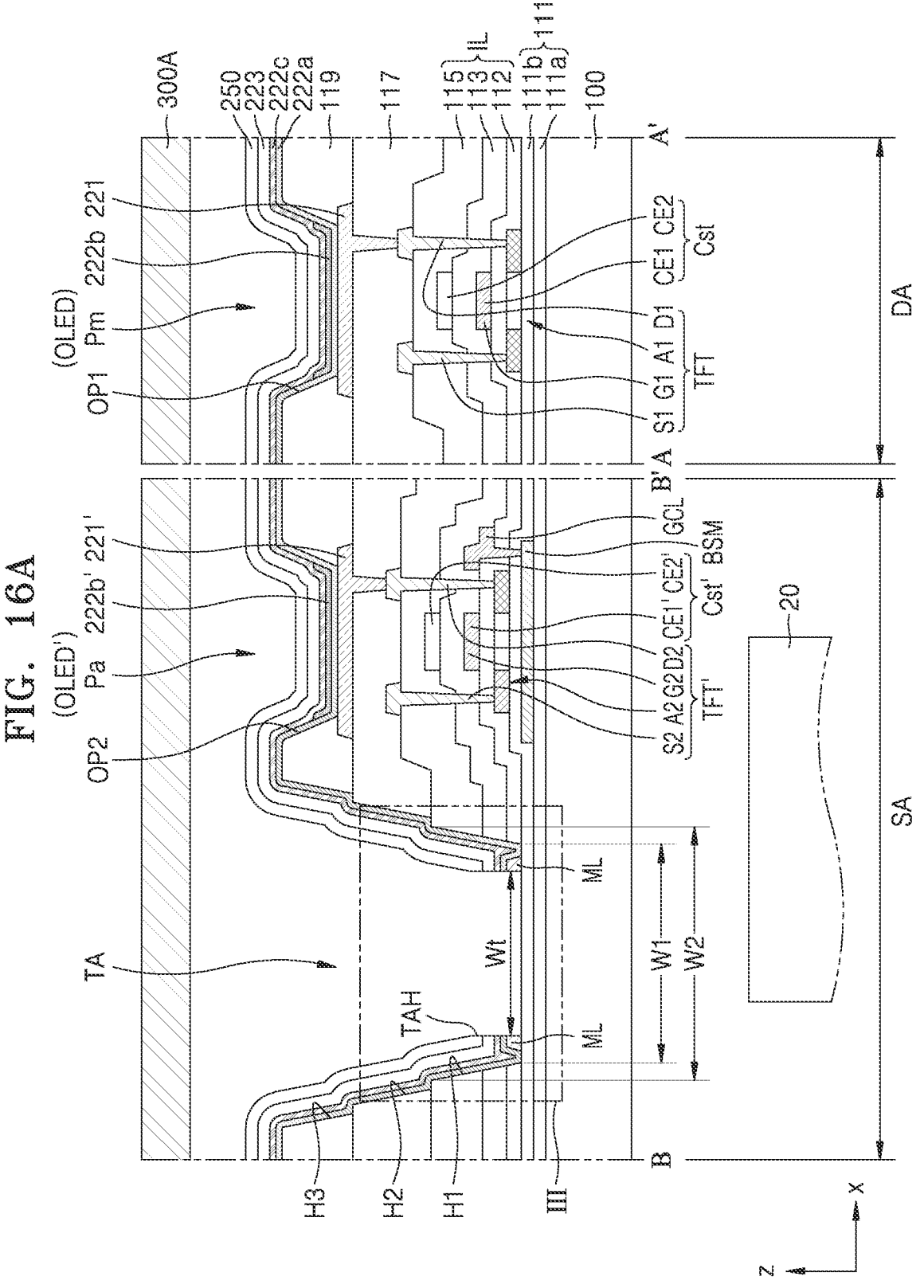
FIG. 16A is a schematic cross-sectional view of the display apparatus, taken along the lines A-A' and B-B' of FIG. 12.
Figure 16B:
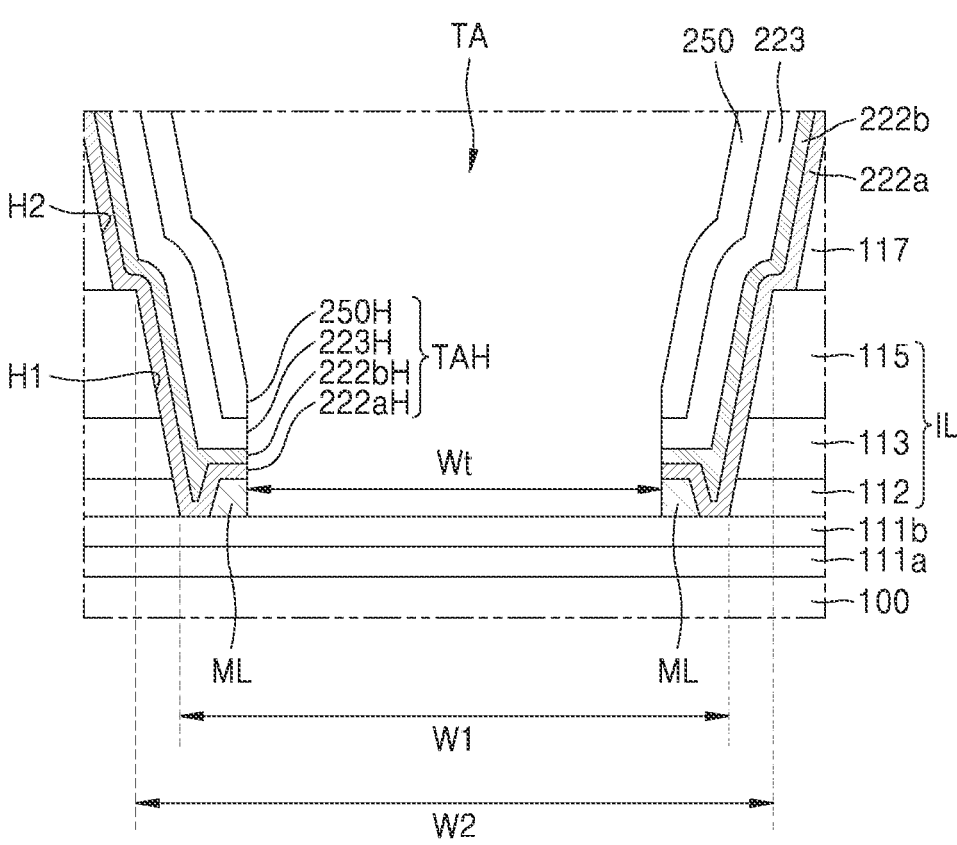
FIG. 16B is an enlarged cross-sectional view of a part III in FIG. 16A.

FIG. 15 is a schematic plan view of a part of the component area SA in FIG. 12. FIG. 16A is a schematic cross-sectional view of the display apparatus 1, taken along the lines A-A' and B-B' of FIG. 12. FIG. 16B is an enlarged cross-sectional view of a transmission portion TA in FIG. 16A.

Referring to FIGS. 15 to 16B, auxiliary pixels Pa and transmission portions TA are arranged in the component area SA of the display apparatus 1 according to one or more embodiments. Certain auxiliary pixels Pa may be arranged (e.g., sequentially arranged) to form one pixel group Pg. At least one auxiliary pixel Pa may be included in the pixel group Pg. In FIG. 15, it is illustrated that one pixel group Pg includes four auxiliary pixels Pa arranged in two columns. However, the present disclosure is not limited thereto. The number and arrangement of auxiliary pixels Pa included in one pixel group Pg may be variously modified in a suitable manner. For example, one pixel group Pg may include three auxiliary pixels Pa arranged side by side in one column.

The transmission portion TA is an area having high light transmittance because no display element is arranged, and a plurality of transmission portions TA may be provided in the component area SA. The transmission portion TA may be alternately arranged with the pixel group Pg in or along the first direction x and/or the second direction y. In one or more embodiments, the transmission portions TA may be arranged to surround the pixel group Pg. In one or more embodiments, the auxiliary pixels Pa may be arranged to surround the transmission portion TA.

In the present embodiment, a metal layer ML arranged to at least partially surround the transmission portion TA is arranged around the transmission portion TA. It may be understood that the metal layer ML is arranged between the transmission portion TA and the pixel group Pg. In FIG. 15, the metal layer ML is illustrated as being continuously arranged to surround one transmission portion TA. However, the present disclosure is not limited thereto. The metal layer ML may be deformed in one or more suitable ways, such as a part thereof may be broken. Various shapes of the metal layer ML will be described below with reference to FIGS. 16A to 16C.

Referring to FIG. 16A, a display apparatus 1 according to one or more embodiments includes a display area DA and a component area SA. The main pixel Pm is arranged in the display area DA, and the auxiliary pixel Pa and the transmission portion TA are arranged in the component area SA.

The main pixel Pm may include a main thin-film transistor TFT, a main storage capacitor Cst, and a main organic light-emitting diode OLED. The auxiliary pixel Pa may include an auxiliary thin-film transistor TFT', an auxiliary storage capacitor Cst', and an auxiliary organic light-emitting diode OLED'. The transmission portion TA may have a transmissive hole TAH to correspond to the transmission portion TA. The metal layer ML is arranged around the transmissive hole TAH.

The component 20 may be arranged in the component area SA. The component 20 may be an IR sensor that transmits/receives infrared. Because the transmission portion TA is arranged in the component area SA, an infrared signal transmitted to or received from the component 20 may be transmitted. For example, light emitted from the component 20 may travel in the z-direction through the transmission portion TA, and light incident on the component 20 generated outside a display apparatus 1 may travel in the −z direction through the transmission portion TA.

Hereinafter, a structure in which components included in a display apparatus 1 according to one or more embodiments of the present disclosure are stacked will be described. In this case, the display apparatus 1 may be the same as or similar to that described with reference to FIG. 8. Hereinafter, for the convenience of description, parts that are different from those of FIG. 8 will be primarily described.

In the component area SA, a lower electrode layer BSM may be arranged between a first buffer layer 111a and a second buffer layer 111b. In another embodiment, the lower electrode layer BSM may be arranged between the substrate 100 and the first buffer layer 111a. The lower electrode layer BSM may be arranged under the auxiliary thin-film transistor TFT' to prevent or reduce deterioration of characteristics of the auxiliary thin-film transistor TFT' by light emitted from the component 20 and/or the like.

Also, the lower electrode layer BSM may be connected to a wiring line GCL arranged on another layer through a contact hole. The lower electrode layer BSM may receive a constant voltage or a signal from the wiring line GCL. For example, the lower electrode layer BSM may receive a driving voltage, that is, the first power supply voltage, or a scan signal. The lower electrode layer BSM may reduce (e.g., significantly reduce) the probability that an electrostatic discharge is generated when a constant voltage or a signal is received. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The lower electrode layer BSM may include a single layer or multiple layers including the above-described material.

The main thin-film transistor TFT and the auxiliary thin-film transistor TFT' may be arranged on the buffer layer 111. The main thin-film transistor TFT includes a first semiconductor layer A1, a first gate electrode G1, a first source electrode S1, and a first drain electrode D1, and an auxiliary thin-film transistor TFT' includes a second semiconductor layer A2, a second gate electrode G2, a second source electrode S2, and a second drain electrode D2. The main thin-film transistor TFT may be connected to the main organic light-emitting diode OLED of the display area DA to drive the main organic light-emitting diode OLED. The auxiliary thin-film transistor TFT' may be connected to the auxiliary organic light-emitting diode OLED' of the component area SA to drive the auxiliary organic light-emitting diode OLED'.

The first semiconductor layer A1 and the second semiconductor layer A2 may be arranged on the buffer layer 111 and may each include polysilicon. In another embodiment, the first semiconductor layer A1 and the second semiconductor layer A2 may each include amorphous silicon. In another embodiment, the first semiconductor layer A1 and the second semiconductor layer A2 may each include an oxide of at least one material selected from the group including indium (In), gallium (Ga), tin (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may each include a channel region, and a source region and a drain region each doped with impurities. The source region and the drain region may be at opposite sides of the channel region.

The second semiconductor layer A2 may overlap the lower electrode layer BSM with the second buffer layer 111b therebetween. As an embodiment, the width (e.g., width in the x-direction) of the second semiconductor layer A2 may be formed to be less than the width (e.g., width in the x-direction) of the lower electrode layer BSM. Therefore, when projected in a direction perpendicular to the substrate 100, the second semiconductor layer A2 may overlap the lower electrode layer BSM as a whole.

A first gate insulating layer 112 may be provided to cover the first semiconductor layer A1 and the second semiconductor layer A2. The first gate insulating layer 112 may include an inorganic insulating material such as $SiO_2$, $SiN_x$, SiON, $Al_2O_3$, $TiO_2$, $Ta_2O_5$, $HfO_2$, or $ZnO_x$. $ZnO_x$ may be ZnO and/or $ZnO_2$. The first gate insulating layer 112 may include a single layer or multiple layers including the above-described inorganic insulating material.

A first gate electrode G1 and a second gate electrode G2 are arranged on the first gate insulating layer 112 to overlap the first semiconductor layer A1 and the second semiconductor layer A2, respectively. The first gate electrode G1 and the second gate electrode G2 may be the same as or similar to the first gate electrode G1 described with reference to FIG. 8.

A second gate insulating layer 113 may be provided to cover the first gate electrode G1 and the second gate electrode G2.

A first upper electrode CE2 of the main storage capacitor Cst and a second upper electrode CE2' of the auxiliary storage capacitor Cst' may be arranged on the second gate insulating layer 113.

In the display area DA, the first upper electrode CE2 may overlap the first gate electrode G1 below the first upper electrode CE2. The first gate electrode G1 and the first upper electrode CE2, which overlap each other with the second gate insulating layer 113 therebetween, may form the main storage capacitor Cst. The first gate electrode G1 may be the first lower electrode CE1 of the main storage capacitor Cst.

In the component area SA, the second upper electrode CE2' may overlap the second gate electrode G2 below the second upper electrode CE2'. The second gate electrode G2 and the second upper electrode CE2', which overlap each other with the second gate insulating layer 113 therebetween, may form the auxiliary storage capacitor Cst'. The second gate electrode G2 may be the second lower electrode CE1' of the auxiliary storage capacitor Cst'.

The first upper electrode CE2 and the second upper electrode CE2' may each include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may include a single layer or multiple layers including the above-described material.

An interlayer insulating layer 115 may be formed to cover the first upper electrode CE2 and the second upper electrode CE2'. When the first gate insulating layer 112, the second gate insulating layer 113, and the interlayer insulating layer 115 are collectively referred to as an inorganic insulating layer IL, the inorganic insulating layer IL may have a first hole H1 corresponding to the transmission portion TA. The first hole H1 may be formed to expose the upper surface of the buffer layer 111 (e.g., the second buffer layer 111b) or the substrate 100. The first hole H1 may be formed of a first opening of the first gate insulating layer 112, a second opening of the second gate insulating layer 113, and a third opening of the interlayer insulating layer 115, which are formed to correspond to the transmission portion TA and overlap one another. The first to third openings may be separately formed through separate processes or may be concurrently (e.g., simultaneously) formed through the same process. In one or more embodiments, one or more suitable modifications are possible, such as the first opening and the second opening being formed at the same time and the third opening being formed separately. When the first to third openings are formed by separate processes, a step may be formed on the side surface of the first hole H1.

The inorganic insulating layer IL may have a groove instead of the first hole H1 exposing the buffer layer 111. For example, in the inorganic insulating layer IL, the first gate insulating layer 112 may be continuously arranged to correspond to the transmission portion TA, and the second gate insulating layer 113 and the interlayer insulating layer 115 may each have a second opening and a third opening to correspond to the transmission portion TA.

In one or more embodiments, the first gate insulating layer 112 and the second gate insulating layer 113 may be sequentially arranged to correspond to the transmission portion TA, and the interlayer insulating layer 115 may have a third opening corresponding to the transmission portion TA. In this manner, one or more suitable modifications are possible.

In another embodiment, the inorganic insulating layer IL may not have the first hole H1 corresponding to the transmission portion TA. Because the inorganic insulating layer IL may have a transmittance by which the component 20 may transmit/receive light, the inorganic insulating layer IL may not have a hole corresponding to the transmission portion TA.

The first and second source electrodes S1 and S2 and the first and second drain electrodes D1 and D2 are arranged on the interlayer insulating layer 115. The first and second source electrodes S1 and S2 and the first and second drain electrodes D1 and D2 may each include a conductive material including molybdenum (Mo), aluminum (Al), copper (Cu), titanium (Ti), and/or the like, and may each include a single layer or multiple layers including the conductive material. For example, the first and second source electrodes S1 and S2 and the first and second drain electrodes D1 and D2 may each have a multilayer structure of Ti/Al/Ti.

A planarization layer 117 may be arranged to cover the first and second source electrodes S1 and S2 and the first and second drain electrodes D1 and D2. The planarization layer 117 may have a flat upper surface such that a first pixel electrode 221 and a second pixel electrode 221' arranged thereon are formed flat.

Figure 16C:
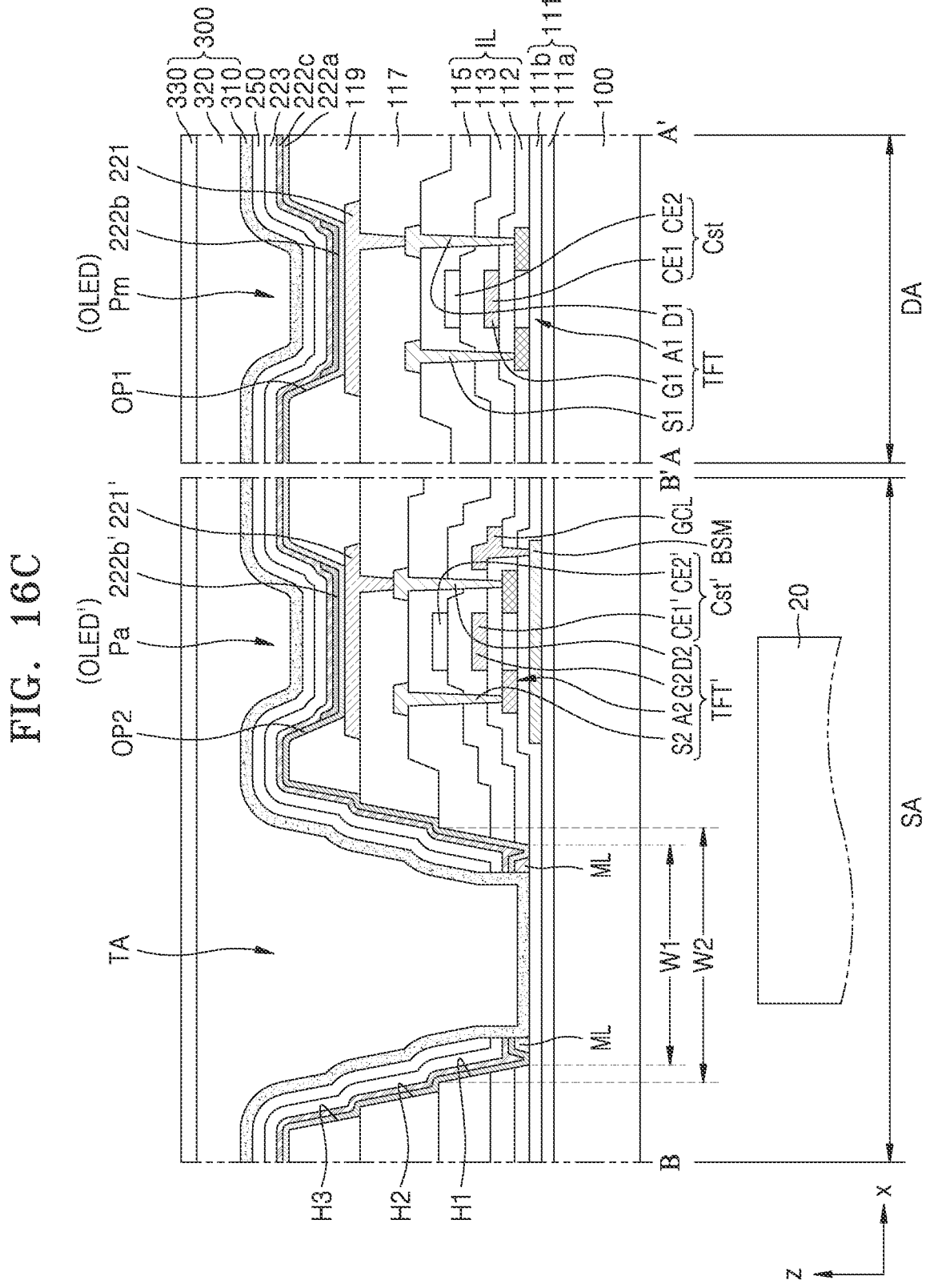
FIG. 16C is a schematic cross-sectional view of a display apparatus according to one or more embodiments.

The planarization layer 117 may have a second hole H2 corresponding to the transmission portion TA. The second hole H2 may be arranged to overlap (e.g., overlap in the thickness direction of the substrate 100) the first hole H1. Although FIGS. 16A to 16C shows that a lower width (e.g., the lower width in the x-direction) W2 of the second hole H2 is greater than a lower width (e.g., the lower width in the x-direction) W1 of the first hole H1, the present disclosure is not limited thereto. For example, the planarization layer 117 may be provided to cover the edge of the first hole H1 of the inorganic insulating layer IL, and thus, the width (e.g., the width in the x-direction) of the second hole H2 may be less than the width (e.g., the width in the x-direction) of the first hole H1.

The planarization layer 117 may have an opening exposing one of the first source electrode S1 and the first drain electrode D1 of the main thin-film transistor TFT, and the first pixel electrode 221 may contact the first source electrode S1 or the first drain electrode D1 through the opening and be connected (e.g., electrically connected) to the main thin-film transistor TFT.

In one or more embodiments, the planarization layer 117 may have an opening exposing one of the second source electrode S2 and the second drain electrode D2 of the auxiliary thin-film transistor TFT', and the second pixel electrode 221' may contact the second source electrode S2 or the second drain electrode D2 through the opening and be connected (e.g., electrically connected) to the auxiliary thin-film transistor TFT'.

The first pixel electrode 221 and the second pixel electrode 221' may be the same as or similar to the first pixel electrode 221 described with reference to FIG. 8.

A pixel-defining layer 119 may cover the edge of each of the first pixel electrode 221 and the second pixel electrode 221'. The pixel-defining layer 119 may include a first opening OP1 exposing the first pixel electrode 221 and a second opening OP2 exposing the second pixel electrode 221'.

The pixel-defining layer 119 may include a third hole H3 located in the transmission portion TA. The third hole H3 may overlap (e.g., overlap in the thickness direction of the substrate 100) the first hole H1 and the second hole H2. As the first hole H1, the second hole H2, and the third hole H3 are formed, the light transmittance of the transmission portion TA may be improved. An opposite electrode 223 to be described below may be arranged on inner walls of the first hole H1, the second hole H2, and the third hole H3.

The metal layer ML may be arranged in the first hole H1, the second hole H2, and the third hole H3. The metal layer ML may be arranged to be spaced from the inner wall of the first hole H1.

The metal layer ML may have a configuration introduced to form a transmissive hole TAH, which will be described below. In one or more embodiments, the metal layer ML may be used to prevent or reduce thermal diffusion when the transmissive hole TAH is formed. The role of the metal layer ML will be described below.

The metal layer ML may include one or more suitable metals. In one or more embodiments, the metal layer ML may be concurrently (e.g., simultaneously) formed of the same material as the first and second pixel electrodes 221 and 221'.

A first functional layer 222a is arranged to cover the pixel-defining layer 119. The first functional layer 222a may include a single layer or multiple layers. The first functional layer 222a may be integrally formed to correspond to the main pixels Pm and the auxiliary pixels Pa included in the display area DA and the component area SA, respectively.

A first emission layer 222b and a second emission layer 222b' formed to correspond to the first pixel electrode 221 and the second pixel electrode 221', respectively, are arranged on the first functional layer 222a. The first emission layer 222b and the second emission layer 222b' may each include a high molecular material or a low molecular material, and may emit red light, green light, blue light, or white light.

A second functional layer 222c may be formed on the first emission layer 222b and the second emission layer 222b'. The second functional layer 222c may include a single layer or multiple layers. The second functional layer 222c may be integrally formed to correspond to the main pixels Pm and the auxiliary pixels Pa included in the display area DA and the component area SA, respectively. The first functional layer 222a and/or the second functional layer 222c may not be provided.

The opposite electrode 223 is arranged on the second functional layer 222c. Layers from the first pixel electrode 221 to the opposite electrode 223, which are formed in the display area DA, may form a main organic light-emitting diode OLED. Layers from the second pixel electrode 221' to the opposite electrode 223, which are formed in the component area SA, may form an auxiliary organic light-emitting diode OLED'.

A capping layer 250 may be formed on the opposite electrode 223.

In the present embodiment, the first functional layer 222a, the second functional layer 222c, the opposite electrode 223, and the capping layer 250 may have a transmissive hole TAH corresponding to the transmission portion TA. For example, the first functional layer 222a, the second functional layer 222c, the opposite electrode 223, and the capping layer 250 may respectively have openings 222aH, 222bH, 223H, and 250H corresponding to the transmission portion TA. In one or more embodiments, the widths of the openings 222aH, 222bH, 223H, and 250H forming the transmissive hole TAH may be substantially the same. For example, the width of the opening 223H of the opposite electrode 223 may be substantially the same as the width of the transmissive hole TAH.

Also, in the present embodiment, the first functional layer 222a, the second functional layer 222c, and the capping layer 250 may not be provided. In this case, the opening 223H of the opposite electrode 223 may become the transmissive hole TAH.

When the transmissive hole TAH corresponds to the transmission portion TA, it may be understood that the transmissive hole TAH overlaps the transmission portion TA. In this case, the area of the transmissive hole TAH may be less than the area of the first hole H1 formed in the inorganic insulating layer IL. To this end, in FIG. 16A, a width (e.g., a width in the x-direction) Wt of the transmissive hole TAH is illustrated to be less than the width (e.g., the width in the x-direction) W1 of the first hole H1. In this case, the area of the transmissive hole TAH and the area of the first hole H1 may be defined by the area of the narrowest opening.

In one or more embodiments, the first functional layer 222a, the second functional layer 222c, the opposite electrode 223, and the capping layer 250 may be arranged on the side surfaces of the first hole H1, the second hole H2, and the third hole H3. In one or more embodiments, the slope of the side surfaces of the first hole H1, the second hole H2, and the third hole H3 with respect to the upper surface of the substrate 100 may be gentler than the slope of the side surface of the transmissive hole TAH with respect to the upper surface of the substrate 100.

The formation of the transmissive hole TAH refers to a member such as the opposite electrode 223 that is removed from the transmission portion TA, and thus, light transmittance in the transmission portion TA may be increased (e.g., significantly increased).

The main organic light-emitting diode OLED and the auxiliary organic light-emitting diode OLED' may be covered with an encapsulation substrate 300A. The encapsulation substrate 300A includes a transparent material. For example, the encapsulation substrate 300A may include a glass material. In one or more embodiments, the encapsulation substrate 300A may include a polymer resin and/or the like. The encapsulation substrate 300A may prevent or substantially prevent external moisture or foreign matter from penetrating into the main organic light-emitting diode OLED and the auxiliary organic light-emitting diode OLED'.

A sealing material such as a sealant may be arranged between the substrate 100, on which the main organic light-emitting diode OLED and the auxiliary organic light-emitting diode OLED' are formed, and the encapsulation substrate 300A. The sealing material may block or reduce external moisture or foreign matter that may penetrate through between the substrate 100 and the encapsulation substrate 300A.

FIG. 16C is a schematic cross-sectional view of a display apparatus according to one or more embodiments. In FIG. 16C, the same reference numerals as those of FIG. 16A denote the same members, and redundant descriptions thereof will not be provided.

Referring to FIG. 16C, in the display apparatus according to the present embodiment, a thin-film encapsulation layer 300 is arranged on a capping layer 250. The thin-film encapsulation layer 300 may include at least one inorganic encapsulation layer and at least one organic encapsulation layer. In this regard, FIG. 16C illustrates that the thin-film encapsulation layer 300 has a structure in which a first inorganic encapsulation layer 310, an organic encapsulation layer 320, and a second inorganic encapsulation layer 330 are stacked. In another embodiment, the number and stacking order of organic encapsulation layers and the number and stacking order of inorganic encapsulation layers may be changed. The thin-film encapsulation layer 300 may be the same as or similar to that described with reference to FIG. 10.

The first inorganic encapsulation layer 310, the organic encapsulation layer 320, and the second inorganic encapsulation layer 330 may be integrally formed to cover a display area DA and a component area SA. Accordingly, the first inorganic encapsulation layer 310, the organic encapsulation layer 320, and the second inorganic encapsulation layer 330 may be arranged inside a transmissive hole TAH (e.g., arranged inside a transmissive hole TAH in a plan view).

In another embodiment, the organic encapsulation layer 320 may be integrally formed to cover the display area DA and the component area SA, but may not be present in a transmission portion TA. In other words, the organic encapsulation layer 320 may include an opening corresponding to the transmission portion TA. In this case, the first inorganic encapsulation layer 310 and the second inorganic encapsulation layer 330 may contact each other inside the transmissive hole TAH.

Figure 17A:
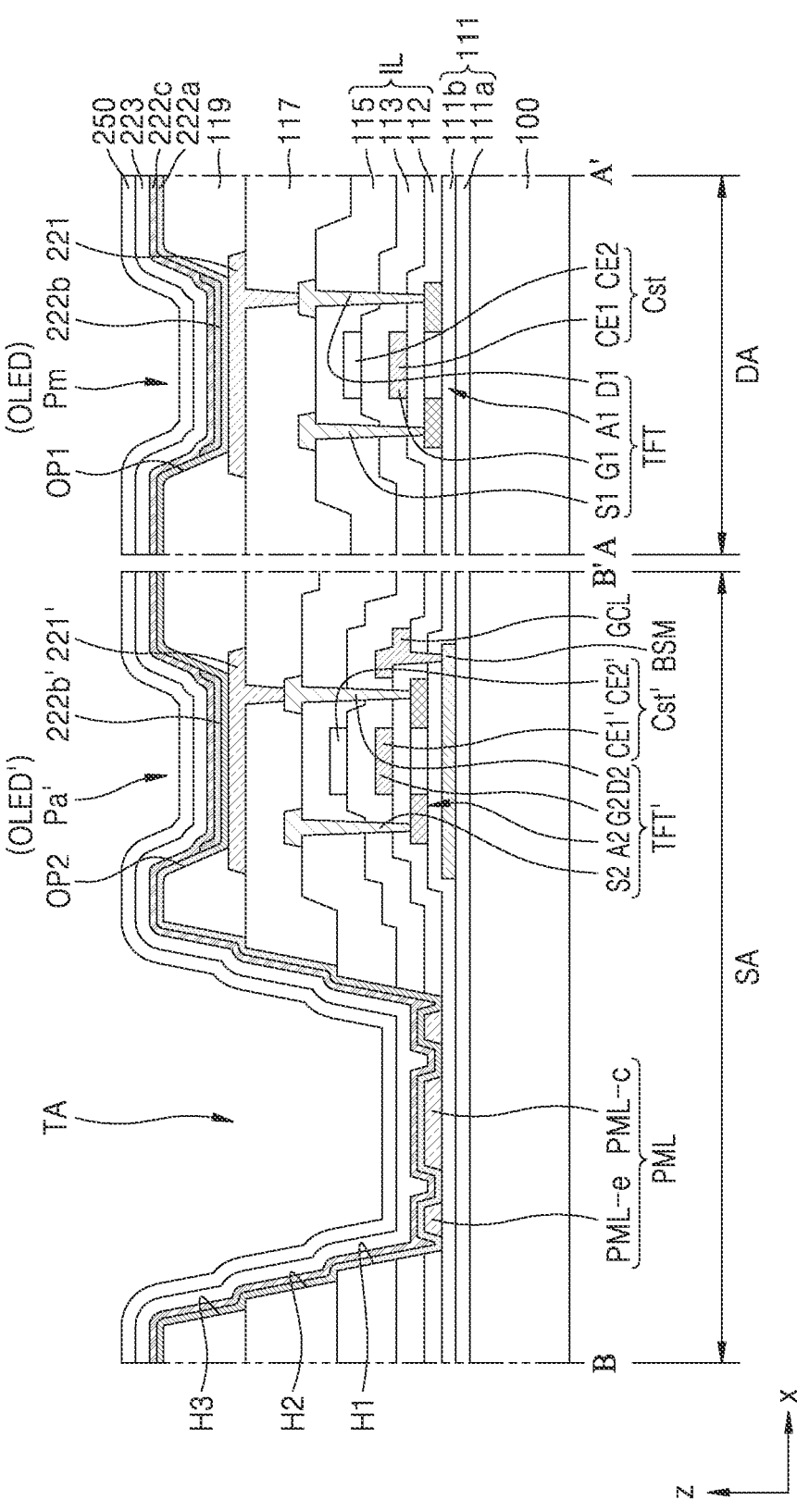
Figure 17B:
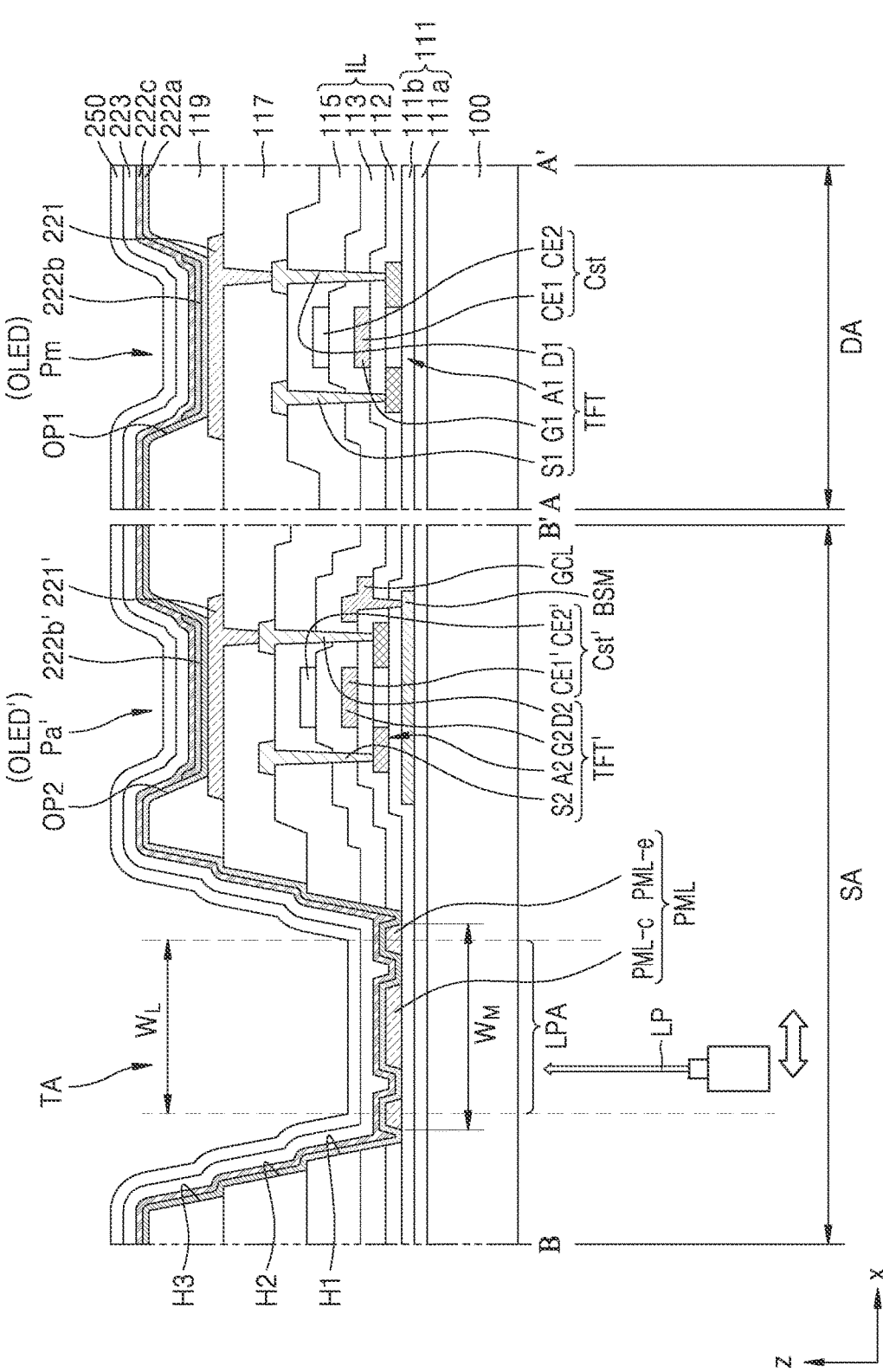
Figure 17C:
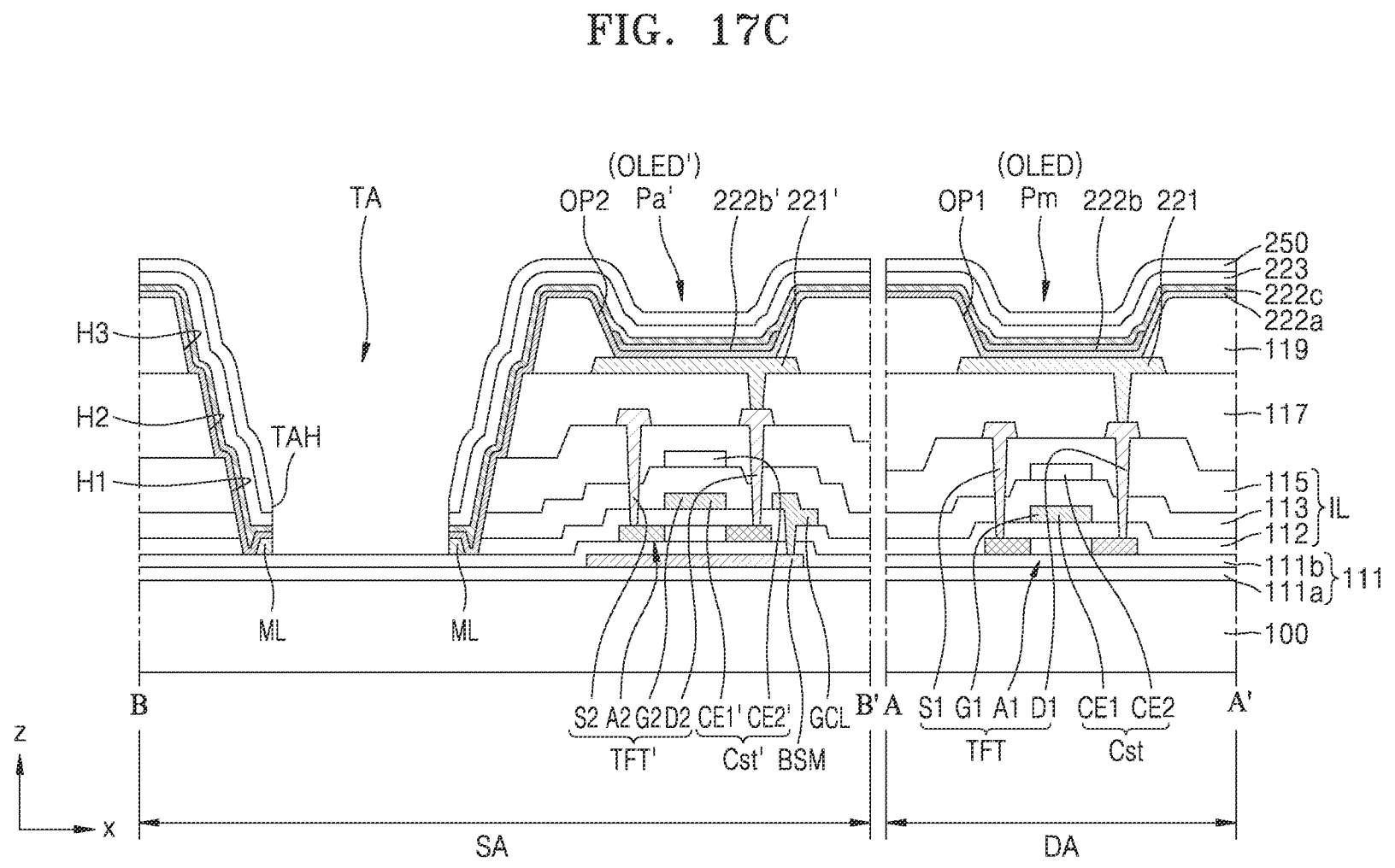

FIGS. 17A to 17C are cross-sectional views illustrating a method of manufacturing a display apparatus according to one or more embodiments.

Referring to FIGS. 17A to 17C, when a display panel is formed, a display substrate may be manufactured and inserted into the apparatus for manufacturing the display apparatus, shown in FIG. 1, in a state in which a pre-metal layer PML is formed in a transmission portion TA. In this case, a test area may be arranged in a peripheral area of the display panel or outside the peripheral area, as shown in FIG. 4C or 4D. Thereafter, a laser may be irradiated to the test area and a processing area at the same time or separately. Thereafter, the relative positions of the test area and a first irradiation area may be determined by measuring a distance (or displacement) between the center of the test area and the center of the first irradiation area.

Thereafter, when the first irradiation area and a second irradiation area are formed in another cell or another display substrate, the laser may be irradiated to an accurate position by varying a position at which the laser is irradiated. In this case, in the second irradiation area, the laser may be irradiated to the entire processing area.

A pre-metal layer PML is formed in a first hole H1 of an inorganic insulating layer IL. The pre-metal layer PML may include a first pre-metal layer PML-c and a second pre-metal layer PML-e. The first pre-metal layer PML-c and the second pre-metal layer PML-e may be spaced from each other. In another embodiment, at least a portion of the first pre-metal layer PML-c and the second pre-metal layer PML-e may be at least partially connected to each other. The first pre-metal layer PML-c may be formed to correspond to most of the transmission portion TA. The second pre-metal layer PML-e may refer to an edge region of the pre-metal layer PML arranged to surround the first pre-metal layer PML-c.

The pre-metal layer PML may include a metal such as silver (Ag), aluminum (Al), platinum (Pt), palladium (Pd), gold (Au), nickel (Ni), molybdenum (Mo), or titanium (Ti). In one or more embodiments, the pre-metal layer PML may further include a layer including ITO, IZO, ZnO, or $In_2O_3$ on/under the above-described metal material. In an embodiment, the pre-metal layer PML may be concurrently (e.g., simultaneously) formed of the same material as pixel electrodes 221 and 221'.

A first functional layer 222a, a second functional layer 222c, an opposite electrode 223, and a capping layer 250, which are integrally formed in a display area DA and a component area SA, are sequentially formed on the pre-metal layer PML.

Next, referring to FIG. 17B, second laser light LP is irradiated to the pre-metal layer PML arranged in the transmission portion TA on the lower surface of the substrate 100. For example, the second laser light LP may travel in the z-direction from the lower surface of the substrate 100 and be irradiated to the lower surface of the pre-metal layer PML. The second laser light LP may have an infrared wavelength. When the second laser light LP is infrared, the transmittance of the substrate 100 and the buffer layer 111 may be about 80% to about 90% or more, and thus, the second laser light LP may efficiently reach the pre-metal layer PML.

Because the pre-metal layer PML includes an opaque metal, the pre-metal layer PML may be to absorb the second laser light LP. Accordingly, thermal expansion of the pre-metal layer PML may occur, and thus, the pre-metal layer PML irradiated with the second laser light LP is lifted off from the substrate 100 or the buffer layer 111.

As a part of the pre-metal layer PML is lifted off, the first functional layer 222a, the second functional layer 222c, the opposite electrode 223, and the capping layer 250, which are arranged on the pre-metal layer PML that is lifted off, may also be removed along with the pre-metal layer PML. Accordingly, as shown in FIG. 17C, the first pre-metal layer PML-c of the pre-metal layer PML may be removed, and a metal layer ML configured of a part of the second pre-metal layer PML-e may be formed. In one or more embodiments, a transmissive hole TAH formed of openings of the first functional layer 222a, the second functional layer 222c, the opposite electrode 223, and the capping layer 250 may be formed.

When, in order to form the transmissive hole TAH, the second laser light LP is irradiated from an upper portion of the substrate 100 in the −z direction, which is the direction of the transmission portion TA, to remove an inorganic material layer, an organic material layer, an opposite electrode, and/or the like, arranged in the transmission portion TA, a laser processing surface may be damaged secondarily by particles generated during the removal process. However, because the present embodiment uses lift-off due to thermal expansion of the pre-metal layer PML, a problem of damage by particles may not occur.

In one or more embodiments, the second laser light LP may be irradiated to the first pre-metal layer PML-c rather than the entire pre-metal layer PML. For example, the area of an irradiation area LPA of the second laser light LP may be less than the area of the pre-metal layer PML. To this end, in FIG. 17B, a width (e.g., a width in the x-direction) WL of the irradiation area LPA of the second laser light LP is illustrated to be less than a width (e.g., a width in the x-direction) $W_M$ of the pre-metal layer PML.

When the second laser light LP is irradiated from the outermost edge of the pre-metal layer PML, heat may be diffused to an auxiliary pixel Pa arranged adjacent to the transmission portion TA, resulting in damage. In the present embodiment, by making the irradiation area LPA of the second laser light LP smaller than the area of the pre-metal layer PML, diffusion of heat by the second laser light LP may be prevented or reduced.

In the pre-metal layer PML, the first pre-metal layer PML-c and the second pre-metal layer PML-e may be arranged to be spaced from each other in order to prevent or reduce the diffusion of heat. In one or more embodiments, a certain pattern may be formed in an edge region of the pre-metal layer PML.

In this case, the second laser light LP may be irradiated to a region where the auxiliary organic light-emitting diode OLED' is arranged in addition to the pre-metal layer PML. Because the second laser light LP is blocked by a lower electrode layer BSM, it is possible to remove only a layer on the pre-metal layer PML arranged in the transmission portion TA without damaging the auxiliary organic light-emitting diode OLED'. As described above, after the pre-metal layer PML arranged in the transmission portion TA, and the first functional layer 222a, the second functional layer 222c, the opposite electrode 223, and the capping layer 250, arranged on the pre-metal layer PML, are removed, an encapsulation substrate or a thin-film encapsulation layer may be formed after the display substrate D is drawn out from the apparatus 2 for manufacturing the display apparatus.

Figure 18:
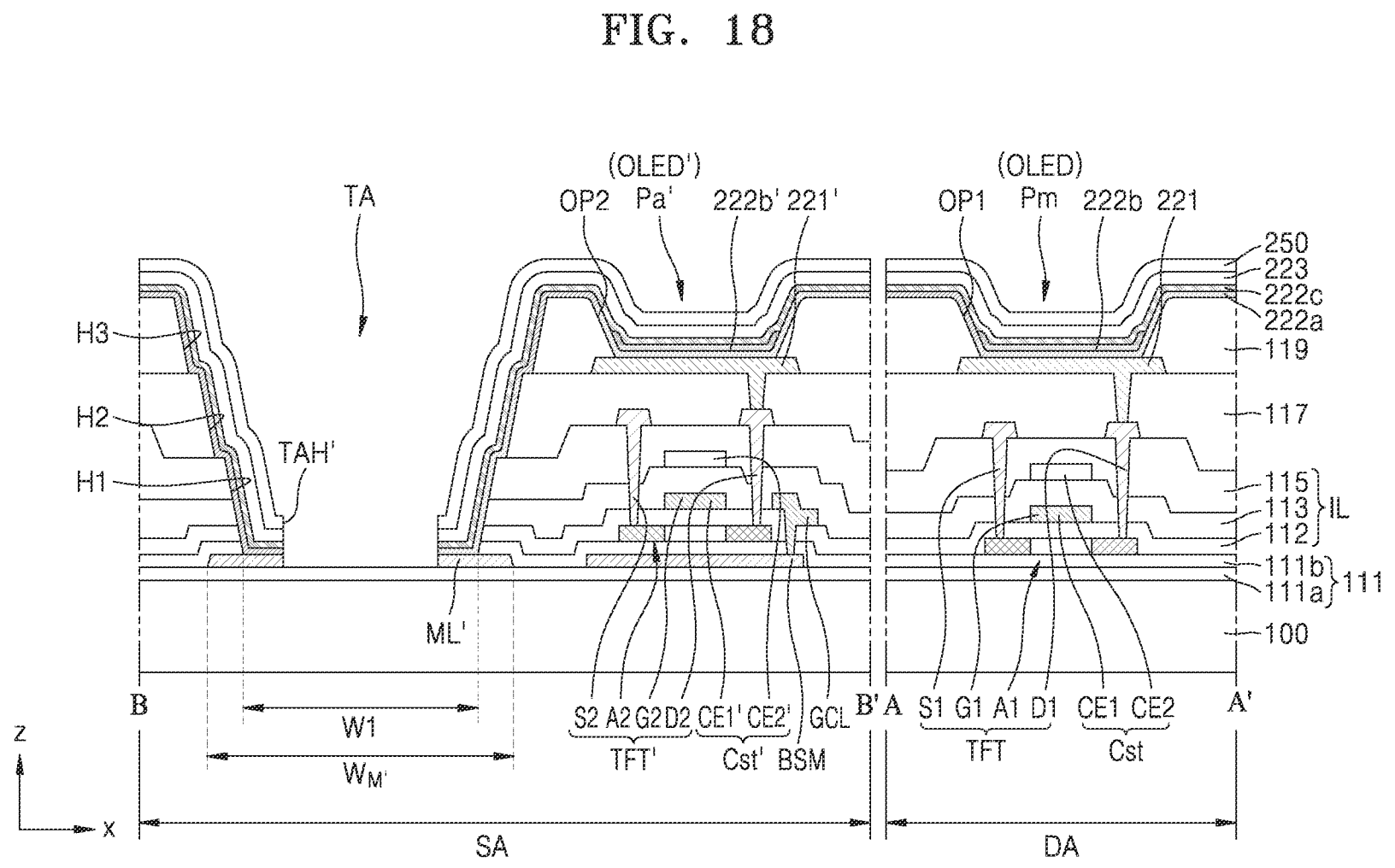

FIG. 18 is a schematic cross-sectional view of a display apparatus according to one or more embodiments.

Referring to FIG. 18, in the present embodiment, a metal layer ML' may include the same material as that of a lower electrode layer BSM. In this case, a transmissive hole TAH' may be formed of an opening of a second buffer layer 111b, an opening of a first functional layer 222a, an opening of a second functional layer 222c, an opening of an opposite electrode 223, and an opening of a capping layer 250.

In one or more embodiments, a metal layer ML' may not be arranged only inside a first hole H1, and the metal layer ML' may be arranged to partially overlap (e.g., partially overlap in the thickness direction of the substrate 100) at least one of a first gate insulating layer 112, a second gate insulating layer 113, and an interlayer insulating layer 115. For example, a width (e.g., a width in the x-direction) $W_{M'}$ of the metal layer ML' may be greater than a width (e.g., a width in the x-direction) W1 of the first hole H1.

In this case, a second laser may be irradiated only to a region where the metal layer ML' is formed.

According to an embodiment of the present disclosure made as described above, by irradiating a laser to a part of a preset processing area of a display substrate before a main processing, a position at which the laser is irradiated may be predicted and corrected, and thus, a method of manufacturing a display apparatus having a reduced defect rate of the display substrate may be implemented. Obviously, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the claims and equivalents thereof.

What is claimed is:

1. A method of manufacturing a display apparatus, the method comprising:
   forming a test area on a display substrate;
   irradiating a first laser to the test area and determining relative positions of the test area and a first irradiation area formed by irradiating the first laser to the test area; and
   correcting a position of a second laser irradiated to the display substrate based on the relative positions of the test area and the first irradiation area.

2. The method of claim 1, wherein the second laser forms an annular second irradiation area within a processing area of the display substrate.

3. The method of claim 2, further comprising removing a part of the display substrate along the processing area.

4. The method of claim 1, further comprising acquiring an image of the test area.

5. The method of claim 1, further comprising calculating a displacement between a center of the test area and a center of the first irradiation area.

6. The method of claim 1, wherein the display substrate comprises a plurality of cells, and
   wherein the test area is arranged inside the plurality of cells or outside the plurality of cells.

7. The method of claim 6, wherein a plurality of first lasers are concurrently irradiated to cells located in a same column from among the plurality of cells.

8. The method of claim 6, wherein a plurality of second lasers are concurrently irradiated to cells located in a same column from among the plurality of cells.

9. The method of claim 6, wherein a cell from among the plurality of cells includes a display area and a peripheral area, and
   wherein the test area is arranged in the peripheral area or outside the peripheral area.

10. A method of manufacturing a display apparatus, the method comprising:
    forming a first irradiation area by irradiating a first laser to a test area of a first display substrate;
    forming a second irradiation area by irradiating a second laser to a processing area of the first display substrate;
    determining relative positions of the test area and the first irradiation area;
    changing an irradiation position of the first laser and an irradiation position of the second laser based on the relative positions of the test area and the first irradiation area;
    irradiating the first laser to a test area of a second display substrate at the changed irradiation position of the first laser; and
    irradiating the second laser to a processing area of the second display substrate at the changed irradiation position of the second laser.

11. The method of claim 10, further comprising photographing the test area and the first irradiation area.

12. The method of claim 10, further comprising calculating a displacement between a center of the test area of the first display substrate and a center of the first irradiation area of the first display substrate.

13. The method of claim 10, wherein each of the first display substrate and the second display substrate comprises a plurality of cells, and
    wherein the test area of each of the first display substrate and the second display substrate, respectively, is arranged inside the plurality of cells or outside the plurality of cells.

14. The method of claim 13, wherein a plurality of first lasers are concurrently irradiated to cells located in a same column from among the plurality of cells.

15. The method of claim 13, wherein a plurality of second lasers are concurrently irradiated to cells located in a same column from among the plurality of cells.

16. The method of claim 13, wherein a cell from among the plurality of cells comprises a display area and a peripheral area, and
    wherein the test area of the first display substrate or the second display substrate is arranged in the peripheral area or outside the peripheral area.

17. The method of claim 13, further comprising separating the plurality of cells of the first display substrate or the second display substrate from each other.

18. The method of claim 17, further comprising removing a part of one of the first display substrate or the second display substrate along the processing area.

19. The method of claim 10, wherein the second irradiation area is annular.

20. The method of claim 10, wherein the first irradiation area has a circular shape, an annular shape, or a cross shape.

\* \* \* \* \*